(12) United States Patent
Kawanago et al.

(10) Patent No.: US 11,482,544 B2
(45) Date of Patent: Oct. 25, 2022

(54) DISPLAY DEVICE

(71) Applicant: Japan Display Inc., Minato-ku (JP)

(72) Inventors: Hiroshi Kawanago, Tokyo (JP); Kazufumi Watabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 287 days.

(21) Appl. No.: 16/924,281

(22) Filed: Jul. 9, 2020

(65) Prior Publication Data

US 2020/0343274 A1 Oct. 29, 2020

Related U.S. Application Data

(63) Continuation of application No. PCT/JP2018/043659, filed on Nov. 28, 2018.

(30) Foreign Application Priority Data

Jan. 10, 2018 (JP) .............................. JP2018-001742

(51) Int. Cl.
*H01L 27/12* (2006.01)
*H01L 51/00* (2006.01)
*G02F 1/1333* (2006.01)

(52) U.S. Cl.
CPC .... *H01L 27/1218* (2013.01); *G02F 1/133305* (2013.01); *H01L 27/1266* (2013.01); *H01L 51/0097* (2013.01); *H01L 2227/326* (2013.01)

(58) Field of Classification Search
CPC ............. H01L 27/1218; H01L 27/1266; H01L 51/0097; H01L 2227/326; G02F 1/133305; G02F 2201/083; G02F 1/133502; G02F 1/133509; Y02E 10/549; G09F 9/00; G09F 9/30

See application file for complete search history.

(56) References Cited

U.S. PATENT DOCUMENTS

2009/0244906 A1* 10/2009 Kim .................. G02F 1/133553
362/327

FOREIGN PATENT DOCUMENTS

JP 11-160652 A 6/1999
JP 2010-54543 A 3/2010

OTHER PUBLICATIONS

International Search Report dated Feb. 19, 2019 in PCT/JP2018/043659 filed Nov. 28, 2018, 2 pages.

\* cited by examiner

*Primary Examiner* — Kyoung Lee
(74) *Attorney, Agent, or Firm* — Maier & Maier, PLLC

(57) ABSTRACT

The purpose of the invention is to manufacture the flexible display device having resin substrate with high throughput and high yield. The structure of the invention is as follows: a display device having plural pixels on a resin substrate comprising: a first layer made of a metal oxide film is formed on a surface of the resin substrate opposite to a surface that the plural pixels are formed, a second layer made of a transparent conductive film is formed in contact with a surface, which is opposite side to the resin substrate, of the first layer.

20 Claims, 25 Drawing Sheets

| SURFACE \ WAVE LENGTH | 1.6 μm | 2.4 μm | 3~5 μm |
|---|---|---|---|
| ALUMINUM OXIDE SURFACE | 0.4 | 0.4 | 0.3 |
| CROMIUM OXIDE SURFACE | 0.8 | 0.8 | 0.8 |
| COPPER OXIDE SURFACE | 0.85 | 0.85 | 0.85 |
| MOLYBDENUM OXIDE SURFACE | 0.8 | 0.8 | 0.8 |
| NICKEL OXIDE SURFACE | 0.85 | 0.85 | 0.85 |
| TITANIUM OXIDE SURFACE | 0.8 | 0.8 | 0.85 |

DISPLAY DEVICE

The present application is a continuation application of International Application No. PCT/JP2018/043659, filed on Nov. 28, 2018, which claims priority to Japanese Patent Application No. 2018-001742, filed on Jan. 10, 2018. The contents of these applications are incorporated herein by reference in their entirety.

BACKGROUND OF THE INVENTION

(1) Field of the Invention

The present invention relates to the display devices, specifically the flexible display devices that the substrates can be curved, and manufacturing method for those display devices.

(2) Description of the Related Art

The organic EL display device and the liquid crystal display device can be used in curved state by making those devices thin. Further, those display devices can be made flexible by making the substrates by resin, e.g. polyimide.

Many layers as conductive layers, insulating layers, protective layers, electrode layers and so forth are formed on the resin substrate. Light transmittance becomes a problem when many layers are formed. Patent document 1 discloses NDF (Neutral Density Filter), in which the metal layer and the dielectric layer are laminated alternatively.

The metal oxide conductive film as ITO (Indium Tin Oxide) is transparent for the visible light; however, it can be a reflective film for the infrared light. Patent document 2 discloses spectral reflectivity of the ITO film

PRIOR TECHNICAL DOCUMENT

Patent Document

Patent document 1: Japanese patent application laid open No. 2010-54543

Patent document 2: Japanese patent application laid open No. Hei 11-160652

SUMMARY OF THE INVENTION

A thickness of the resin substrate used in the flexible display device is 10 to 20 microns. Such a thin substrate is formed as that e.g. liquid resin is coated on a glass substrate, then it is baked to become a thin resin substrate. The resin substrate passes through the manufacturing process with the glass substrate until the display panel is completed; after that, the glass substrate is removed from the resin substrate, then, the flexible display device is realized.

Such a process has following problems. The resin substrate is formed as follows: the precursor, which is liquid, is coated on the glass substrate, then baked. The baking needs a very long time. In addition, when the substrate becomes bigger, local non-uniformity in thermosetting of the resin tends to occur. Specifically, this problem becomes bigger when the resin substrate becomes thicker.

In addition, the thermal expansion of the glass substrate and the resin substrate are different from each other, thus, a deformation occurs, even in a state that the resin substrate is adhered to the glass substrate, according to the temperature distribution in the substrates during the thermosetting. If the substrate deforms, it becomes difficult to pass the manufacturing process.

The purpose of the present invention is to overcome the above explained problems and to enable to produce display devices of stable characteristics with high through put.

The present invention overcomes the above explained problem; the concrete structures are as follows.

(1) A display device having plural pixels on a resin substrate comprising:

a first layer, made of a metal oxide film, formed on a surface of the resin substrate opposite to a surface that the plural pixels are formed, a second layer, made of a transparent conductive film, formed in contact with a surface, which is opposite side to the resin substrate, of the first layer.

(2) A display device having a laminated substrate including a first substrate made of resin, a second substrate made of resin laminated on the first substrate, and plural pixels on the second substrate comprising:

a first layer, made of a metal oxide film, formed in contact with a surface of the first substrate opposite to the second substrate, a second layer, made of a transparent conductive film, formed in contact with a surface of the first layer opposite to the second substrate, a third layer, made of a metal oxide film, formed in contact with a surface of the second substrate opposing to the first substrate, a fourth layer, made of a transparent conductive film, formed in contact with a surface of the third layer opposing to the first substrate.

(3) A display device having a laminated substrate including a first substrate made of resin, a second substrate made of resin laminated on the first substrate, and plural pixels on the second substrate, wherein;

a first layer made of a metal oxide film is formed in contact with a surface of the first substrate opposite to the second substrate, a second layer made of a transparent conductive film is formed in contact with a surface of the first layer, or the third layer made of a metal oxide film is formed in contact with a surface of the second substrate opposing to the first substrate, the fourth layer made of a transparent conductive film is formed in contact with a surface of the third layer.

DETAILED DESCRIPTION OF THE PREFERRED EMBODIMENTS

The present invention is explained by the following embodiments.

Embodiment 1

Figure 1:
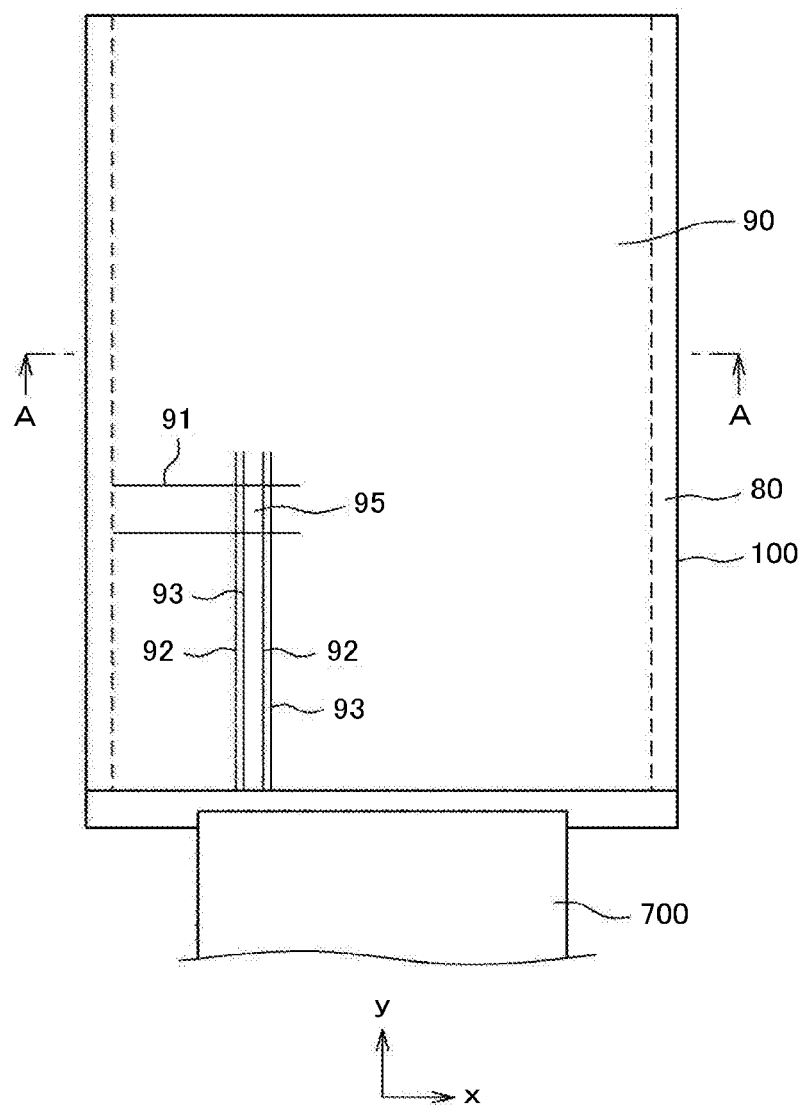
FIG. 1 is a plan view of the organic EL display device.

FIG. 1 is a plan view of the organic EL display device, to which the present invention is applied. The organic EL display device according to the present invention is the display device that can be curved flexibly. The TFT substrate 100 is made of resin, on which the TFTs (Thin Film Transistor), scan lines, power lines, video signal lines, pixel electrodes, organic EL layers and so forth are formed.

In FIG. 1, the scan line driving circuits 80 are formed at both sides of the display area 90. In the display area 90, the scan lines 91 extend in lateral direction (x direction) and arranged in longitudinal direction (y direction). The video signal lines 92 and the power lines 93 extend in the longitudinal direction and arranged in lateral direction. The pixel 95 is defined by area surrounded by the scan lines 91 and the video signal lines 92 or the power lines 93. In the pixel 95, the driving transistor, the switching transistor, (each of them is formed by TFT), the organic EL layer that emits light, and so on are formed.

Figure 2:
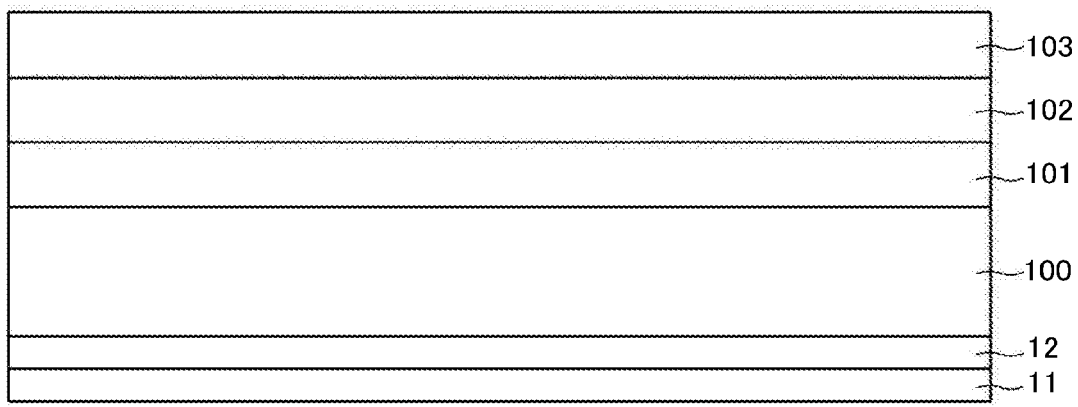
FIG. 2 is a cross sectional view along the line A-A of FIG. 1 according to the present invention.

FIG. 2 is a cross sectional view along the line A-A of FIG. 1. In FIG. 2, the TFT substrate 100 is made of resin. Among resins, polyimide has excellent characteristics for the substrate of the display device because of its heat resistance, mechanical strength and so on. Therefore, the polyimide is premised to be used for the TFT substrate 100 herein after; however, the present invention is applicable to the case when the TFT substrate 100 is made of other resins. A thickness of the TFT substrate 100 is e.g. 10 to 20 microns.

The TFT wiring layer 101 is formed on the TFT substrate 100. The TFT wiring layer 101 includes: scan lines, video signal lines, power lines, organic EL layers, which emit light, anodes, which work as pixel electrodes, cathodes, which work as the common electrodes, and so forth. The protective layer 102 is formed covering the TFT wiring layer 101. The characteristics of the organic EL layer are deteriorated by moisture and so forth; the protective layer 102 suppresses intrusion of moisture from the outside, and also mechanically protects the organic EL layer.

The circular polarizing plate 103 is disposed on the protective layer 102. The TFT circuit layer 101 has reflection electrodes, which reflect external light. The circular polarizing plate 103 prevents the reflection of external light; consequently, visibility of the screen is improved.

Figure 36:
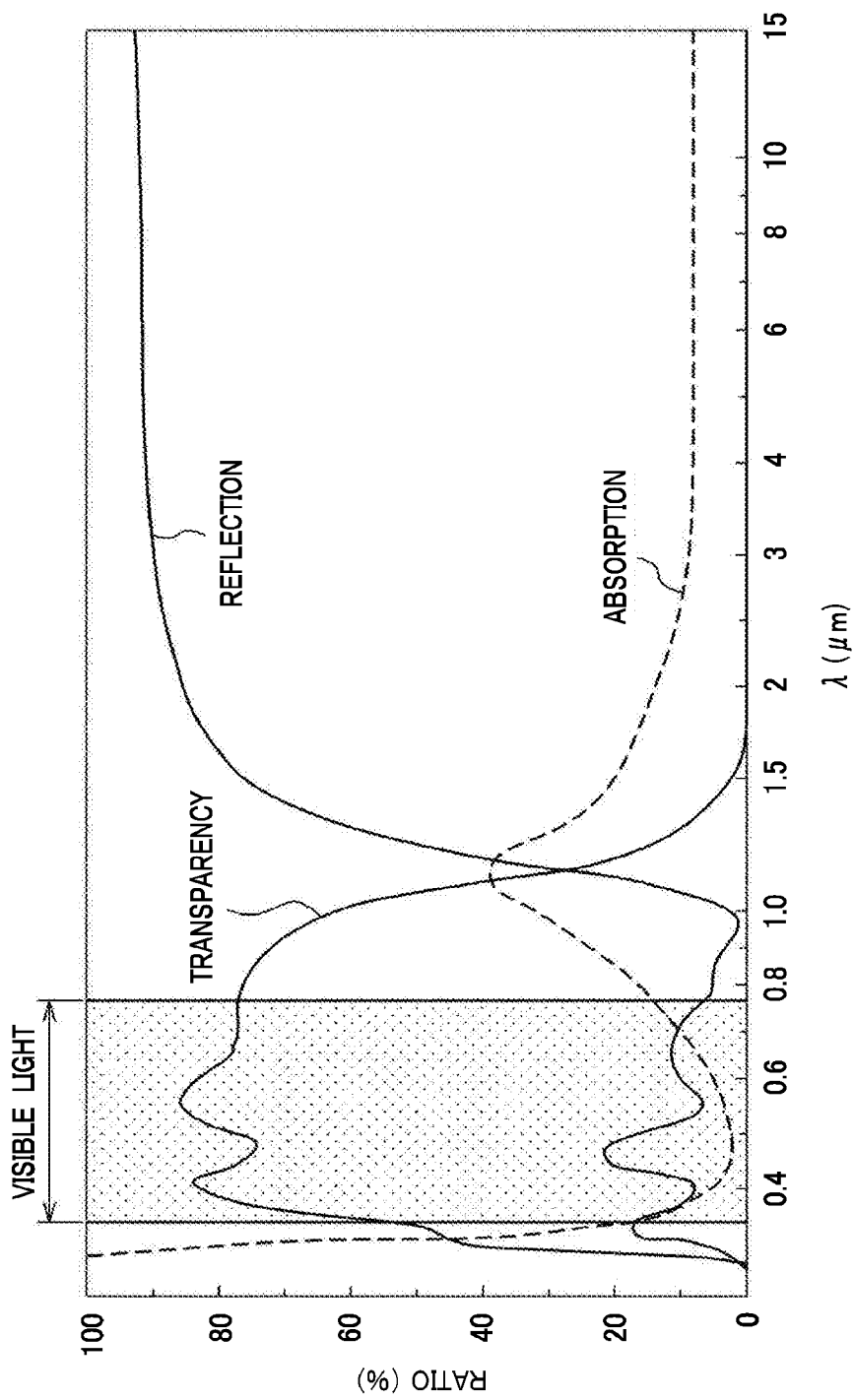
FIG. 36 is a graph that shows spectral characteristics of transmittance, reflection and absorption by the ITO film.
Figures 37, 38:
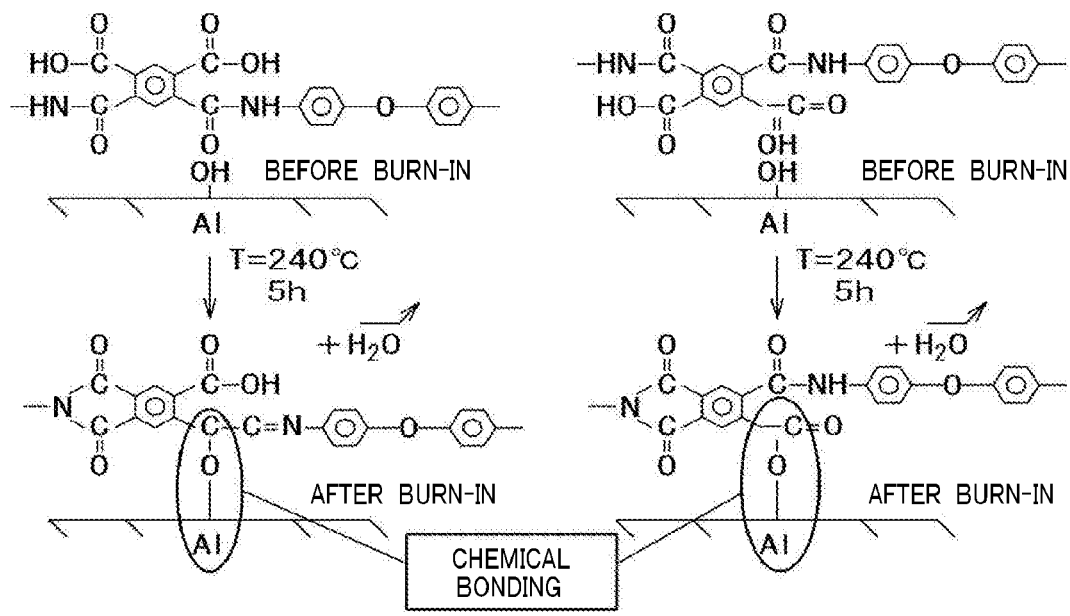
FIG. 37 is a table that shows absorption ratio to the infrared light of various wave length by various metal oxides.
FIG. 38 is a model that shows bonding between the aluminum atoms and the polyimide.

In FIG. 2, the infrared absorption layer 12 is formed by metal oxide under the TFT substrate 100; and the infrared reflection layer 11 formed by transparent conductive film is formed under the infrared absorption layer 12. Unlike the name of transparent conductive film, the ITO, for example, becomes a good reflector to the infrared light of wave length of 1.5 microns or more as shown in FIG. 36. The metal oxide film can be a good absorption layer to the infrared light as shown in FIG. 37. The existence of the infrared absorption layer 12 and the infrared reflection layer 11 characterizes the present invention. The polyimide substrate 100 is formed as follows: the liquid containing polyamic acid (herein after polyamic acid) as the material for the polyimide is coated on the glass substrate 500, then, it is heated and baked. It takes a long time to complete baking, e.g. it takes 4 to 8 hours to bake if the normal oven is used. The present invention uses infrared heating for shortening of baking and uniformity of heating. Consequently, the infrared absorbing layer 12 and infrared reflecting layer 11 have an important role in the present invention.

Figure 3:
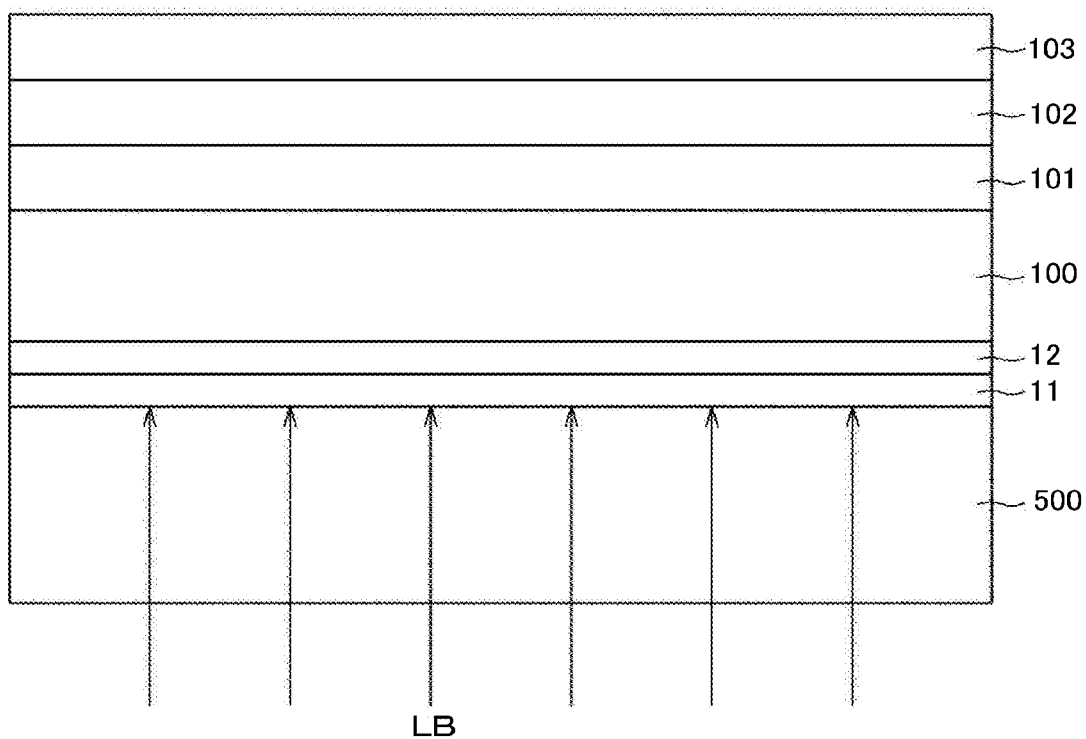
FIG. 3 is a cross sectional view that the glass substrate is being separated from the TFT substrate according to the present invention.

By the way, since the polyimide substrate 100, which is 10 to 20 microns thick, is flexible, it cannot pass through the manufacturing process. Therefore, the polyimide substrate 100 is made pass through the manufacturing process with the glass substrate 500. As shown in FIG. 3, after the display device is completed, the laser beam (LB) is irradiated at the interface of the TFT substrate 100 and the glass substrate 500 to separate them. In this invention, as depicted in FIG. 3, the laser beam (LB) is irradiated at the interface between the glass substrate 500 and the infrared reflection layer 11 to separate them; and thus, the TFT substrate 100 and the glass substrate 500 are separated.

FIG. 3 is a cross sectional view that shows an interim structure in a process to form the structure of FIG. 2. In FIG. 3, the TFT substrate 100 is formed by polyimide on the glass substrate 500; in this invention, however, the transparent conductive film, as the infrared reflection layer 11, and, the metal oxide film, as the infrared absorbing layer 12, are formed on the glass substrate 500 before the TFT substrate 100 is formed.

In FIG. 3, the polyimide substrate 100 is formed on the infrared absorbing layer 12. The polyimide substrate 100 is formed as that: polyamic acid as the precursor is coated by e.g. slit coater on the glass substrate and baked. The TFT circuit layer 101, which constitutes the essential portion of the organic EL display, is formed on the TFT substrate 100. The TFT circuit layer 101 is the same as explained in FIG. 2. After that, the protective layer 102 is formed, and, after that, the circular polarizing plate 103 is adhered.

As shown in FIG. 3, several elements are formed on the glass substrate 500 in the manufacturing process of the flexible display device. A thickness of the glass substrate 500 is 0.5 mm or 0.7 mm, which are easily procured in the market. However, the glass substrate 500 needs to be removed after the flexible display device is completed. In FIG. 3, the laser beam (LB) is irradiated to the interface between the infrared reflection layer 11 and the glass substrate 500 to separate the infrared reflection layer 11 and the glass substrate 500 by so called laser abrasion; and thus, to separate the TFT substrate 100 and the glass substrate 500.

FIGS. 4 to 10 are cross sectional views to show the process from forming the TFT substrate 100 by polyimide to separating the TFT substrate 100 from the glass substrate 500. By the way, in manufacturing the organic EL display device or the liquid crystal display device, it is not efficient to make a single display panel individually, thus, many display panels are formed in the mother substrate and then, separated to an individual display panel. Herein after, even the explanation is made for an individual display panel, it is the same to the mother substrate.

Figure 4:
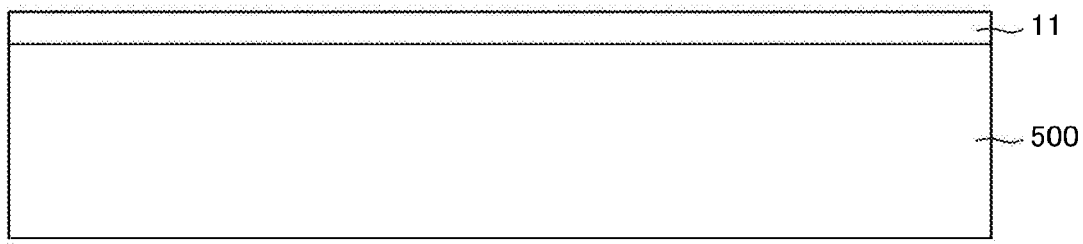
FIG. 4 is a cross sectional view that the infrared reflection layer is formed on the glass substrate.
Figure 39:
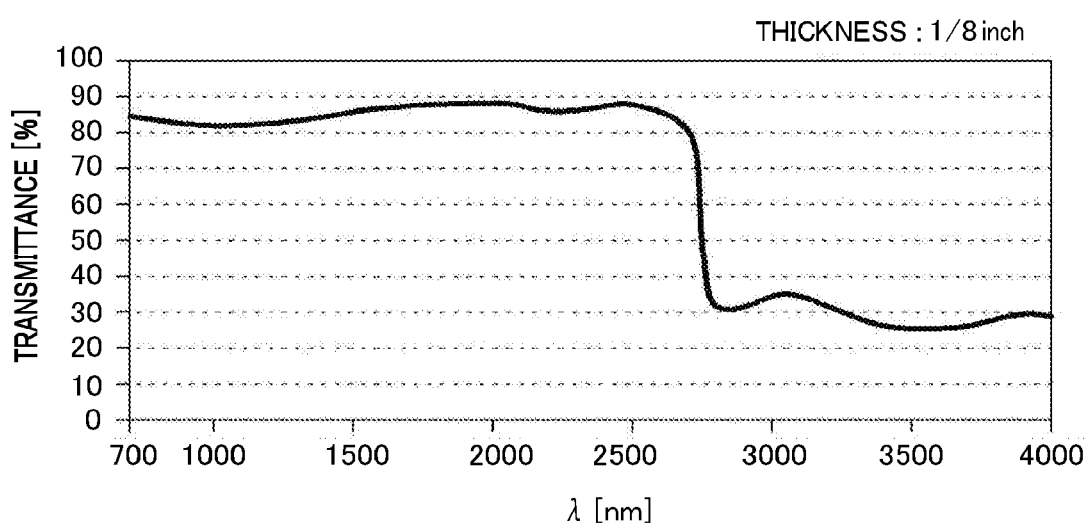
FIG. 39 is a graph that shows spectral transmittance of the glass.

FIG. 4 is a cross sectional view that the transparent conductive film 11 as the infrared reflective layer is formed on the glass substrate 500. In this invention, the infrared heating is used to bake the polyamic acid, which is the precursor of the polyimide, because of efficiency and controllability of heating. The absorbance of infrared light by the polyamic acid is low. On the other hand, the absorbance of infrared light by glass is still low, although the absorbance is higher than to the visible light. FIG. 39 is a spectral transmittance of the soda-lime glass of a thickness of ⅛ inches (3.17 mm). The transmittance for the infrared light of wave length of 2 microns is 90%; however, when the wave length becomes more than 2.7 microns, the transmittance decreases drastically to be approximately 30%. When those data are interpreted with the glass of a thickness of 0.5 mm, which is used on the display device, the transmittance is 85%, which means most of the infrared light pass through the glass substrate 500 even the infrared light of the wave length of more than 2.7 microns is used. Namely, heating efficiency is low.

To counter measure this problem, the present invention uses the infrared reflecting layer 11 on the glass substrate 500. A thickness of the infrared reflecting layer 11 is 50 to 100 nm, typically 75 nm. The transparent conductive film as ITO, IZO (Indium Zinc Oxide), AZO (Antimony Zinc Oxide) and etc. can be used as the infrared reflection layer 11, however, ITO is generally used. Herein after the ITO film is represented for the infrared reflection layer 11.

The ITO film is transparent to the visible light; however, it has a high reflectivity to the infrared light of wave length of 1.5 microns or more. FIG. 36 is a graph that shows spectral reflectivity of the ITO film. As shown in FIG. 36, the ITO film has a reflectivity of 75% or more to the infrared light of the wave length of 1.5 microns and 85% or more to the infrared light of the wave length of 2.0 microns. The ITO film 11 in FIG. 4 is formed by sputtering in a thickness of 50 to 150 nm, typically, 75 nm.

Figure 5:
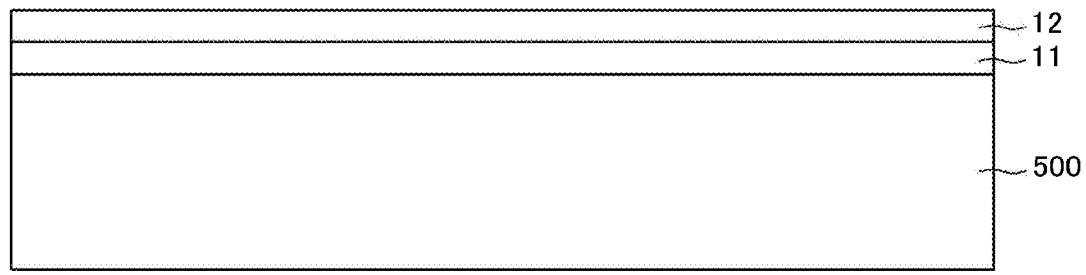
FIG. 5 is a cross sectional view that the infrared absorption layer is formed on the infrared reflection layer.

FIG. 5 is a cross sectional view that the metal oxide film as the infrared absorption layer 12 is formed on the infrared reflection layer 11. The metal oxide film can be a good absorption layer to the infrared light. Even the metal film can be a good absorption entity to the infrared light when its surface is oxidized. FIG. 37 is a table that shows absorption rates of several metals, which are used in the display devices, when the surfaces of those metals are oxidized. Each of them shows high absorbance.

The infrared absorption layer 12 in this invention can be formed by sputtering the metal and oxidize the film in the oxide environment, or can be formed by sputtering the oxide metal itself, or can be formed by reactive sputtering. In either cases, a thickness of the infrared absorption layer is 10 to 100 nm, typically 50 nm.

Another important characteristics of the infrared absorption layer 12 is to have a good adhesiveness with the polyimide film since the polyimide substrate 100 is formed on the infrared absorption layer 12. From this point, the aluminum oxide has superior characteristics. The reaction shown in FIG. 38 is advocated to explain a strong adhesiveness between the polyimide film and the film having Al atoms. Namely, in an imide bonding process from the polyamic acid to the polyimide, the amide group and the carboxyl group, which originally react in intra molecular reaction, individually reacts with OH group of AlOOH by dehydration reaction. Even mechanism is slightly different, Cr, Ti and forth can be used as the infrared absorption layer 12 to improve adhesive strength with the polyimide film.

Provided the infrared ray of a wave length of 2 microns is used, the absorbance is 0.4 when the aluminum oxide film 12 is used as the infrared absorption layer 12, while the absorbance is 0.15 when the ITO is used as the infrared reflection layer 11. Namely, when the ITO film 11 is disposed as a lower layer and the aluminum oxide film 12 is disposed as an upper layer, the ITO film works as the infrared reflection layer 11 and the aluminum oxide film (aluminum oxide film may be expressed as AlO, hereinafter) works as the infrared absorption layer 12. As shown in FIG. 37, Cr or Ti has even better characteristics as the infrared absorption layer 12.

Figure 6:
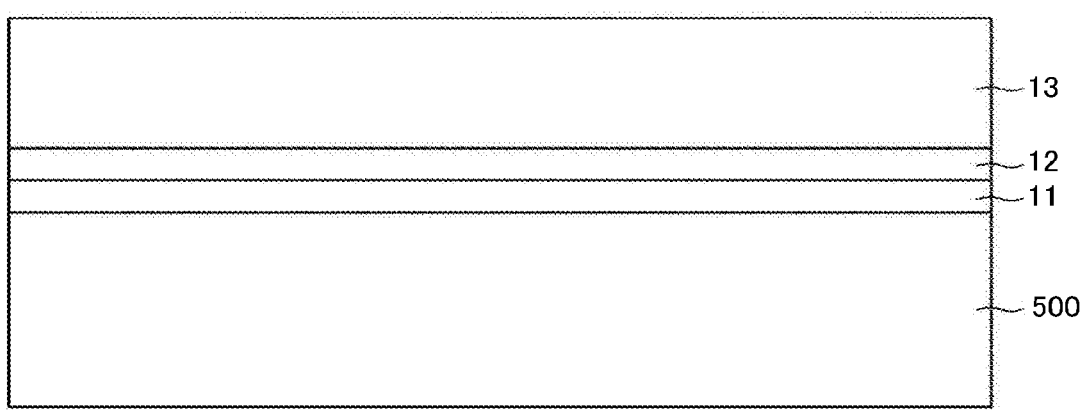
FIG. 6 is a cross sectional view that the polyamic acid is coated on the infrared absorption layer.

FIG. 6 is a cross sectional view that polyamic acid 13, which is the precursor of the polyimide, is coated by e.g. slit coater on the infrared absorption layer 12. The polyimide substrate 100 is formed by baking the polyamic acid 13 at 300 to 500 centigrade. The polyamic acid 13 is coated in a thickness so that a thickness of the polyimide substrate 100 becomes 10 to 20 microns. In this invention, the infrared heating is used to control heating of the polyamic acid 13 accurately and efficiently.

Figure 7:
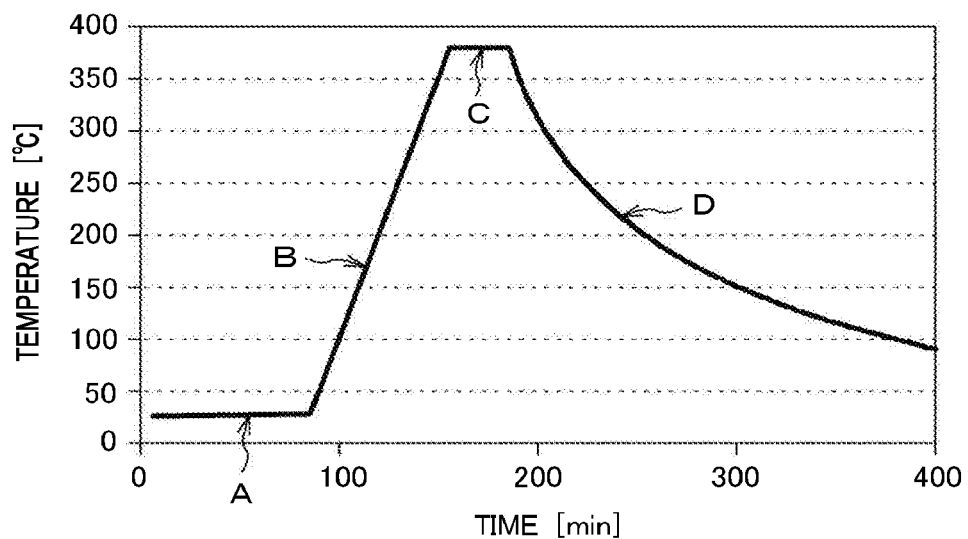
FIG. 7 is a temperature profile for curing the polyamic acid to form the polyimide.

FIG. 7 is a temperature profile for the baking of the substrate 500. The temperature means the temperature of the substrate 500. The temperature profile is divided into four regions. The region A is room temperature; during this period, partial pressure of oxygen in the environment in the oven is made 10 ppm by replacing by nitrogen. In the region B, the substrate 500 is heated in a temperature rising rate of 4 degrees Celsius/minute. In the region B, the reactions to change the polyamic acid to the polyimide progress. In the subsequent region C, polyimide molecules are aligned by keeping the substrate at high temperature for 30 minutes. After that, in the region D, the substrate is cooled down by natural cooling in the nitrogen environment.

By the way, since the infrared light transmits the polyamic acid, the efficiency of heating is a problem. When polyamic acid 13 is coated on the glass substrate 500, the infrared light, which has transmitted the polyamic acid 13, also transmits the glass. As explained in FIG. 39, the heating efficiency is low because the transmittance of the glass substrate 500 of a thickness of approximately 0.5 mm is 85% even when the infrared light of wave length of 2.5 microns or more is used. In other words, it is not efficient to heat the polyamic acid 13 by heating the glass substrate 500.

Figure 8:
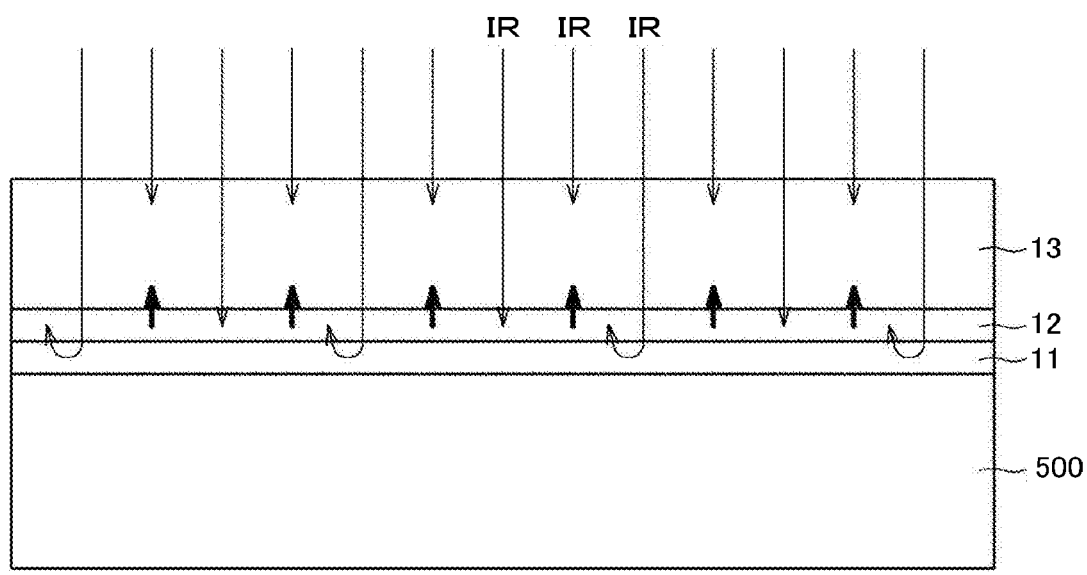
FIG. 8 is a cross sectional view that shows a mechanism to heat the polyamic acid according to the present invention.
Figure 9:
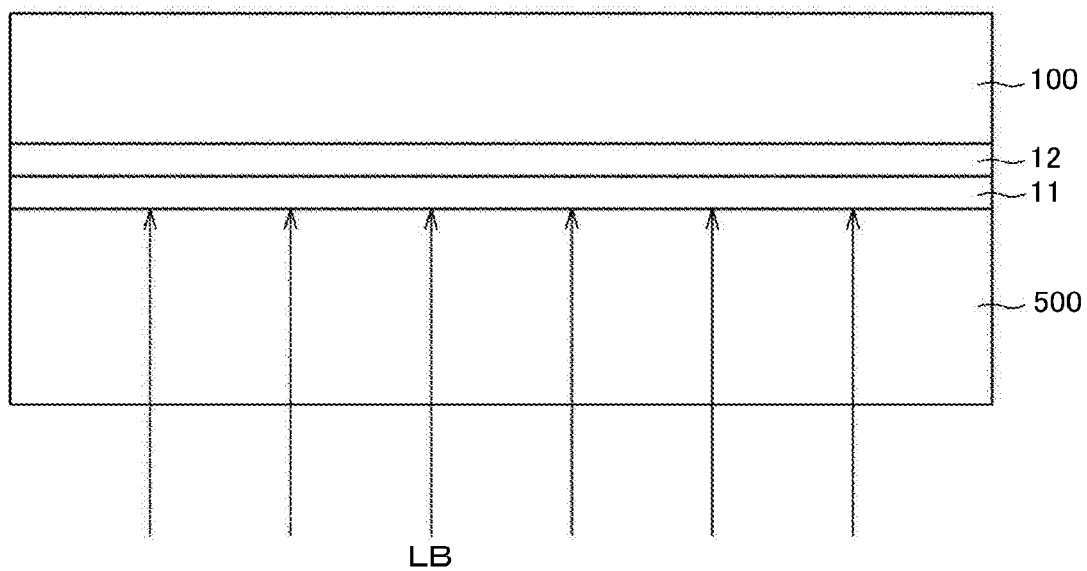
FIG. 9 is a cross sectional view that the laser beam is irradiated to separate the glass substrate from the TFT substrate.

FIG. 8 is a cross sectional view to show the principle to bake the polyamic acid 13 according to the present invention. In FIG. 8, the ITO film is formed as the infrared reflection layer 11 in a thickness of 75 nm on the glass substrate 500; the metal oxide film is formed as the infrared absorption layer 12 in a thickness of 50 nm on the infrared reflection layer 11. The AlO film is used as the infrared absorption layer 12 in this embodiment. The polyamic acid 13 is coated on the AlO film 12 in a thickness so that a thickness of the polyimide substrate 100 becomes 10 to 20 microns.

In FIG. 8, when the infrared light IR is irradiated to the polyamic acid 13, a part of it is absorbed in the polyamic acid 13, however, most of it reaches to the lower layer of AlO film 12. The absorption ratio of the infrared light by the AlO film 12 is approximately 30%, thus, most of the infrared light reflects at the AlO film and reenter the polyamic acid 13 and heats the polyamic acid 13. On the other hand, the infrared light that absorbed in the AlO film 12 heats up the AlO film 12 itself; however, since a thickness of the AlO film 12 is approximately 50 nm, most of the infrared light transmits the AlO film 12.

In this invention, however, the ITO film 11 is formed under the AlO film 12. As shown in FIG. 36, the reflectance by the ITO film 11 is 75% or more when the infrared light IR of a wave length of 1.5 microns or more is used, and is 85% or more when the infrared light IR of a wave length of 2 microns or more is used. The reflected infrared light heats the AlO film 12 again, and the infrared light IR that has transmitted the AlO film 12 heats the polyamic acid 13 again.

By the way, the temperature of the AlO film, which works as the infrared absorbing layer 12, rises. The heat of the AlO film 12 transmits to the pilyamic acid 13 by conductance as shown by thick arrows in FIG. 8. As described above, most of the infrared light IR, which transmits the layers and is not used for heating if the present invention is not applied, can be used for heating the polyamic acid 13 in the present invention; therefore, the heat efficiency can be raised much and, thus, baking time for the polyamic acid 13 can be significantly shortened.

Figure 10:
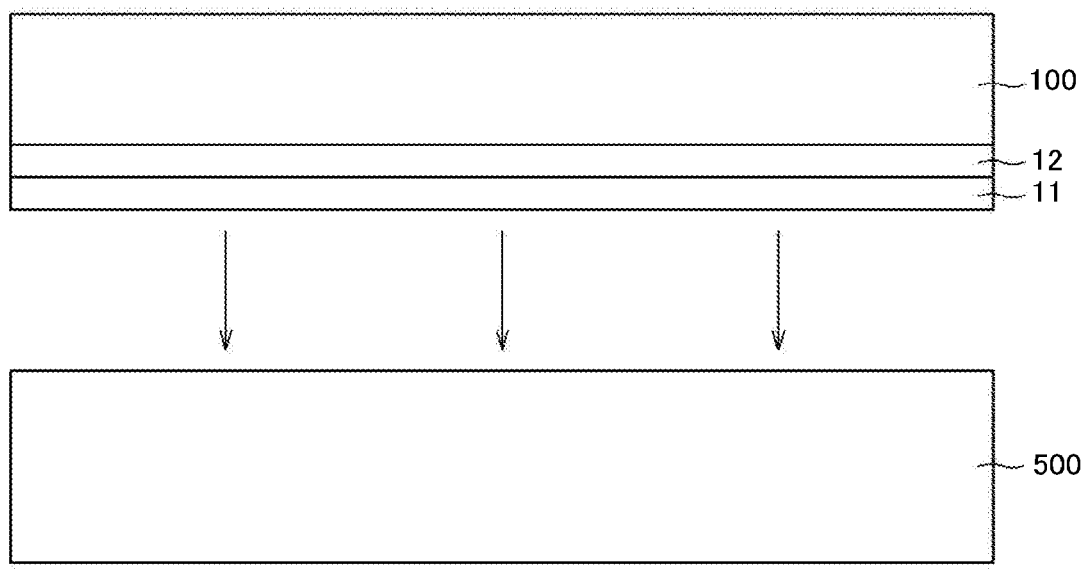
FIG. 10 is a cross sectional view that the glass substrate is being separated from the TFT substrate.

After the TFT substrate 100 of polyimide is formed as described above, the TFT circuit layer 101 and the protective layer 102 are formed on the TFT substrate 100. Subsequently, as described in FIG. 9, the laser beam is irradiated between the ITO film, which is the infrared reflection layer 11, and the glass substrate 500 to separate the ITO film 11 and the glass substrate 500 by abrasion. FIG. 10 is a cross sectional view that the glass substrate 500 is removed from the TFT substrate 100. As described in FIG. 10, the infrared reflection layer 11 and the infrared absorption layer 12 stick to the TFT substrate 100.

FIGS. 11 to 15 show an example of a variation of the present embodiment. In sometimes, according to the conditions, there happens that the glass substrate 500 cannot be removed in an example of FIG. 9, in which the laser beam is irradiated between the glass substrate 500 and the ITO film 11. To countermeasure this problem, the release layer 14 is formed between the ITO film 11 and the glass substrate 500. FIGS. 11 to 15 show the process for this structure.

Figure 11:
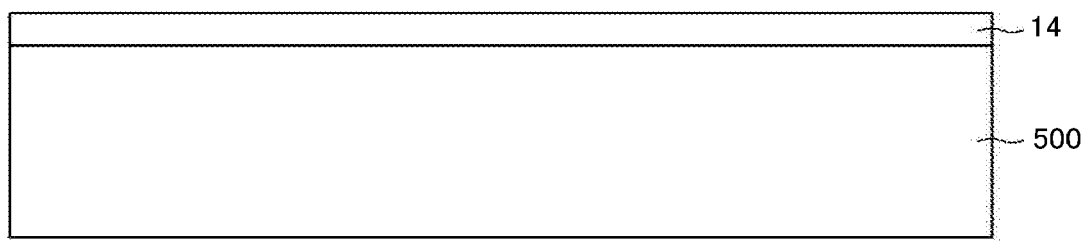
FIG. 11 is a cross sectional view that the release layer is formed on the glass substrate.
Figure 12:
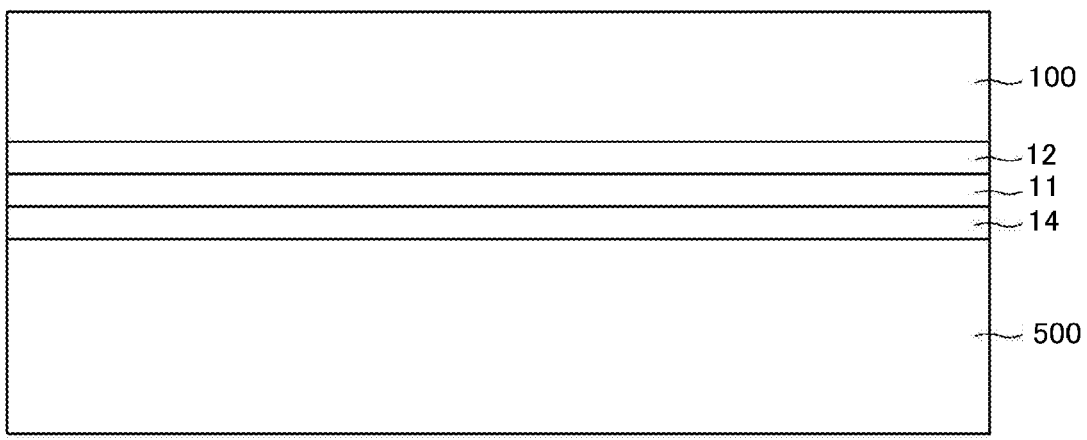
FIG. 12 is a cross sectional view that the infrared reflection layer, the infrared absorption layer and the polyimide substrate are formed on the glass substrate.
Figure 13:
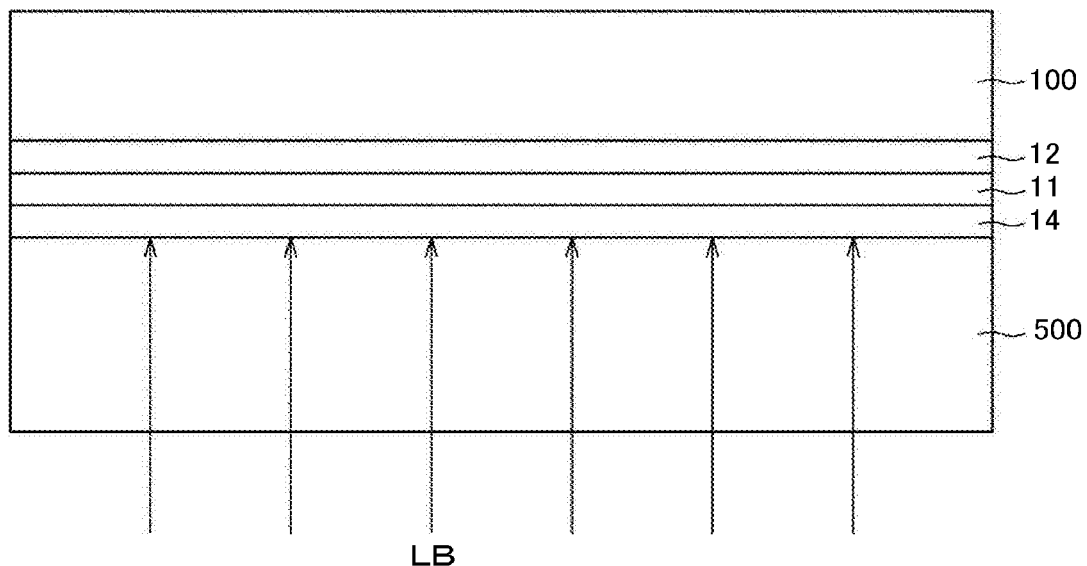
FIG. 13 is a cross sectional view that the laser beam is being irradiated on the release layer.
Figure 14:
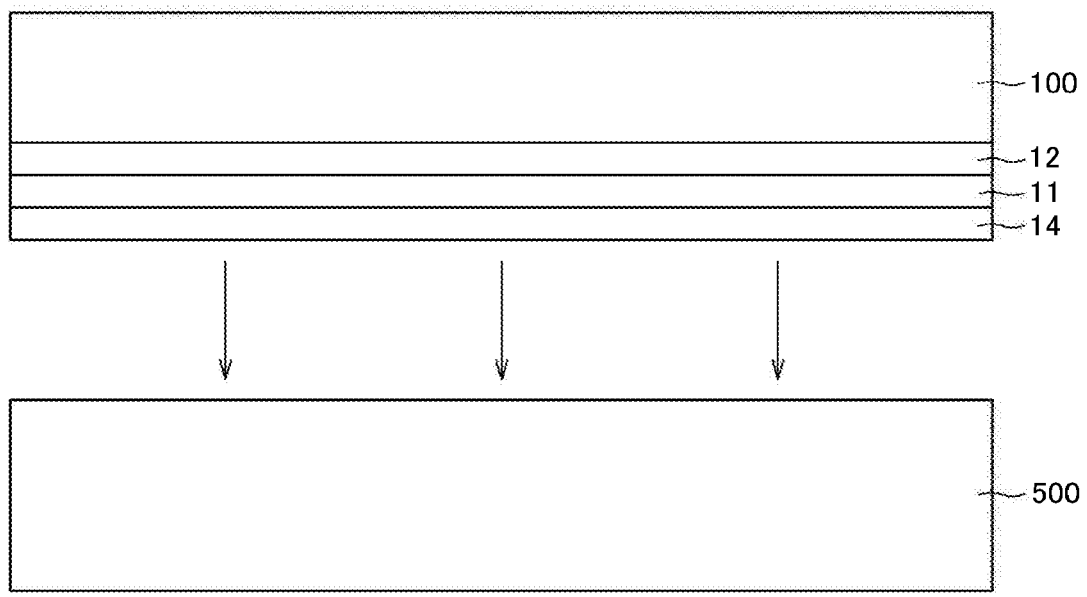
FIG. 14 is a cross sectional view that the glass substrate is separated from the TFT substrate.

FIG. 11 is a cross sectional view that the release layer 14 is formed on the glass substrate 500. The release layer 14 can be a metal film or laminated film of an insulating film and a metal film. After that, as shown in FIG. 12, the infrared reflection layer 11, the infrared absorption layer 12 and the polyimide substrate 100 are formed in this order. Subsequently, the TFT circuit layer 101 and the protective layer 102 and so forth are formed. After that, as depicted in FIG. 13, the laser beam LB is irradiated to the release layer 14 at the interface between the release layer 14 and the glass substrate 500; consequently, as shown in FIG. 14, the glass substrate 500 is removed from the TFT substrate 100. In FIG. 14, the release layer 14 sticks to the TFT substrate 100, however, the release layer 14 can stick to the glass substrate 500.

As described above, according to the present invention, the polyimide substrate 100 can be formed efficiently and in short time using infrared light.

Embodiment 2

The substrate must have certain mechanical strength even in a flexible display device. Among the resins, polyimide is superior in mechanical strength, however, it takes a long time for thermosetting. To countermeasure this problem, polyimide substrate can be made by two layers. Namely, some occasions, laminating thin films is profitable than forming one thick layer. Such a structure is called the tandem structure. The present invention has a high effect even in the tandem structure.

Figure 15:
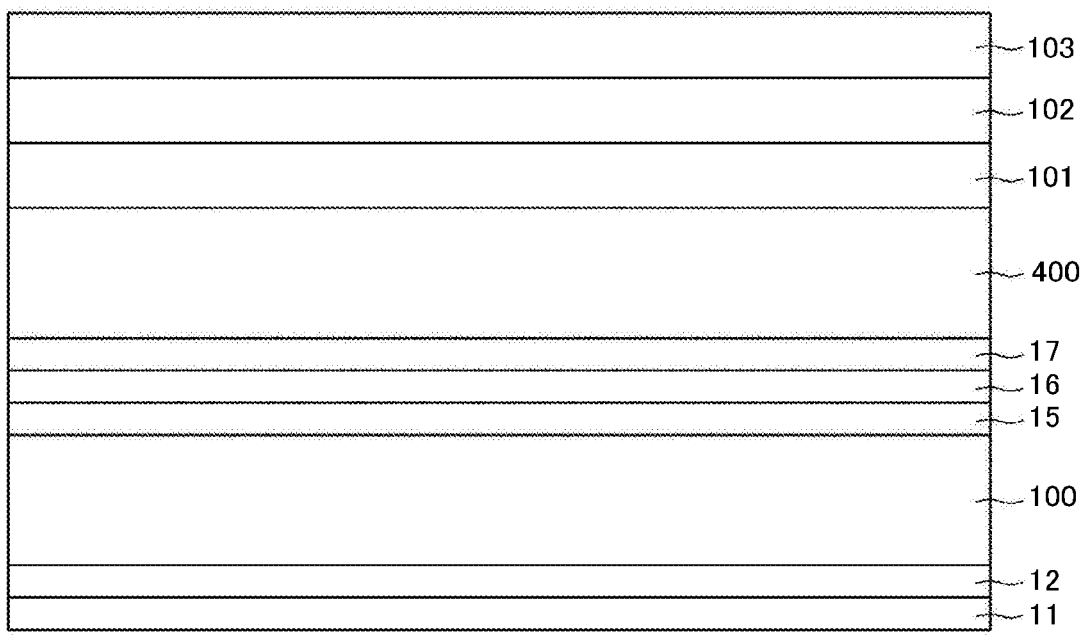
FIG. 15 is a cross sectional view of the structure of embodiment 2.

FIG. 15 is a cross sectional view of the tandem structure. In FIG. 15, the first TFT substrate 100 and the second TFT substrate 400, both are made of polyimide, are laminated. The first TFT substrate 100 is the lower layer and the second TFT substrate 400 is the upper layer; under each of the first TFT substrate 100 and the second substrate 400, the infrared absorbing layer 12, 17 formed by metal oxide as AlO and forth, and the infrared reflecting layer 11, 16 formed by transparent conductive film as ITO and forth are formed. The structure and the function of the infrared absorbing layer 12, 17 and the infrared reflecting layer 11, 16 are the same as explained in embodiment 1.

In FIG. 15, the silicon oxide (herein after represented by SiO) film 15 is formed between the first TFT substrate 100 and the ITO film 16, formed as the infrared reflection layer 16 under the second TFT substrate 400, to strengthen the adhesive strength between the ITO film 16 and the first TFT substrate 100. If adhesive strength between the lower polyimide substrate 100 and the upper infrared reflection layer 16 is strong enough, the SiO film 15 can be eliminated. The TFT circuit layer 101, protective layer 102 and the circular polarizing plate 103 are formed on the second TFT substrate 400. Each of the elements on the second TFT substrate 400 is the same as explained in embodiment 1.

Figure 16:
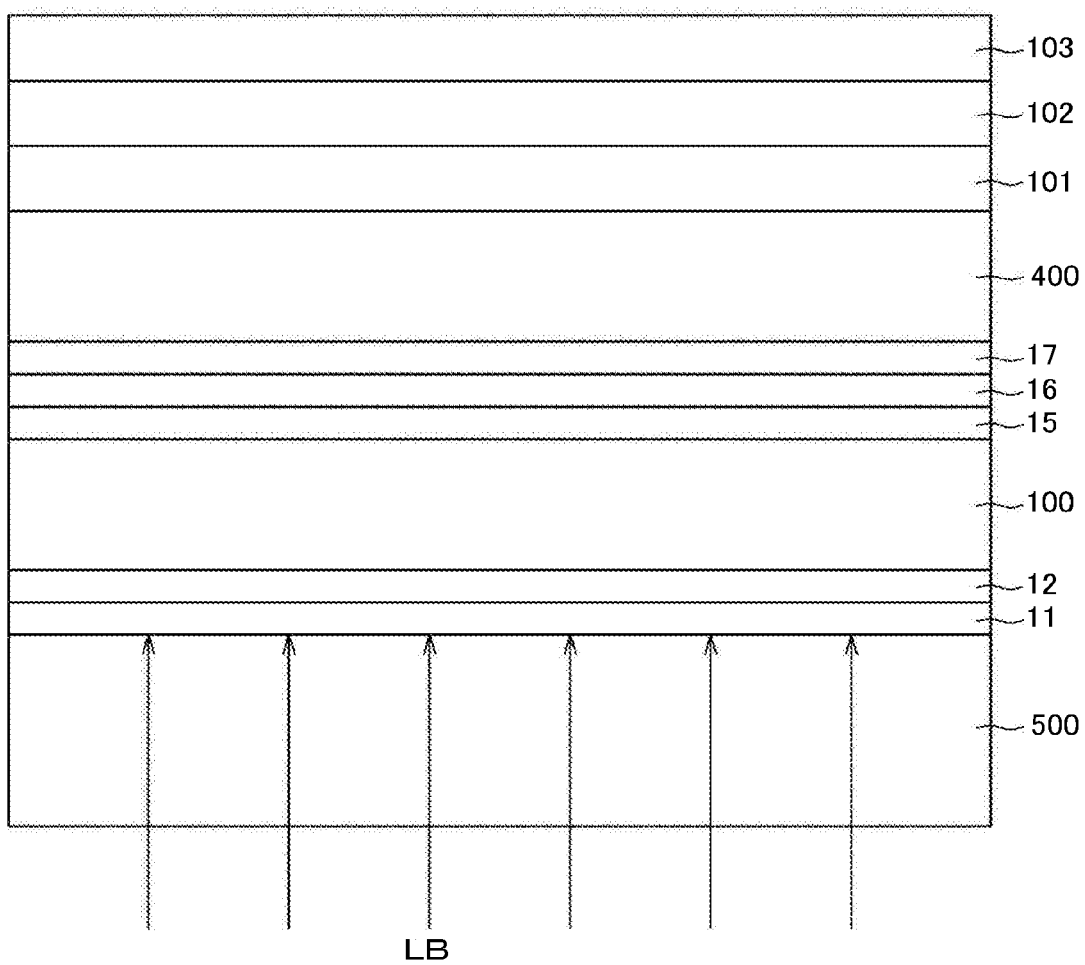
FIG. 16 is a cross sectional view that the laser beam is being irradiated to separate the glass substrate from the TFT substrate.

In the tandem structure of FIG. 15, too, several elements are formed on the glass substrate 500, then the glass substrate 500 is removed after the display device is completed by laser beam abrasion as shown in FIG. 16, which is explained in embodiment 1. In the tandem structure, since the TFT substrate is formed by laminated structure of two TFT substrates, each of which is thinner than the TFT substrate of embodiment 1, the baking time for each of the TFT substrates can be shortened.

Figure 17:
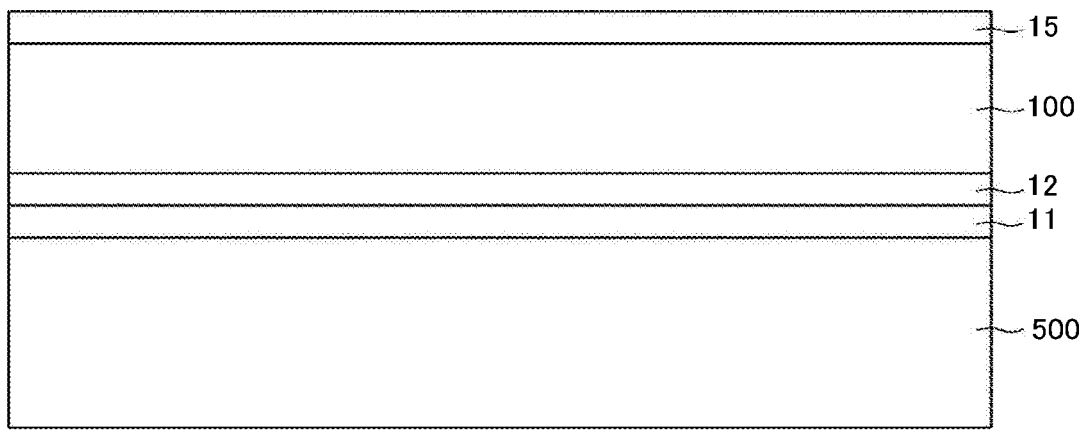
FIG. 17 is a cross sectional view that the first TFT substrate is formed on the glass substrate, and the silicon oxide film is formed on the first TFT substrate.

FIG. 17 is a cross sectional view that the first infrared reflection layer 11, the first infrared absorption layer 12, and the first TFT substrate 100 of polyimide are formed in this order on the glass substrate 500 by the process explained in embodiment 1, then the SiO film 15 is formed on the first polyimide film 100. The SiO film 15 is formed in a thickness of e.g. 100 to 200 nm.

Figure 18:
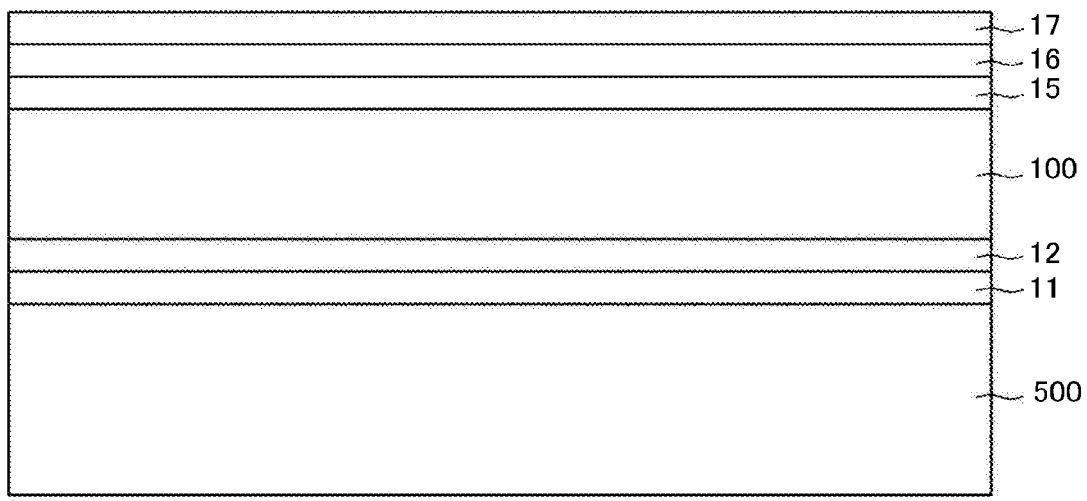
FIG. 18 is a cross sectional view that the second infrared reflection layer and the second infrared absorption layer are formed on the silicon oxide film.

FIG. 18 is a cross sectional view that the second infrared reflection layer 16 and the second infrared absorption layer 17 are formed on the SiO film 15 in this order. The structure and manufacturing method of the second infrared reflection layer 16 and the second infrared absorption layer 17 are the same as the first infrared reflection layer 11 and the first infrared absorption layer 12.

Figure 19:
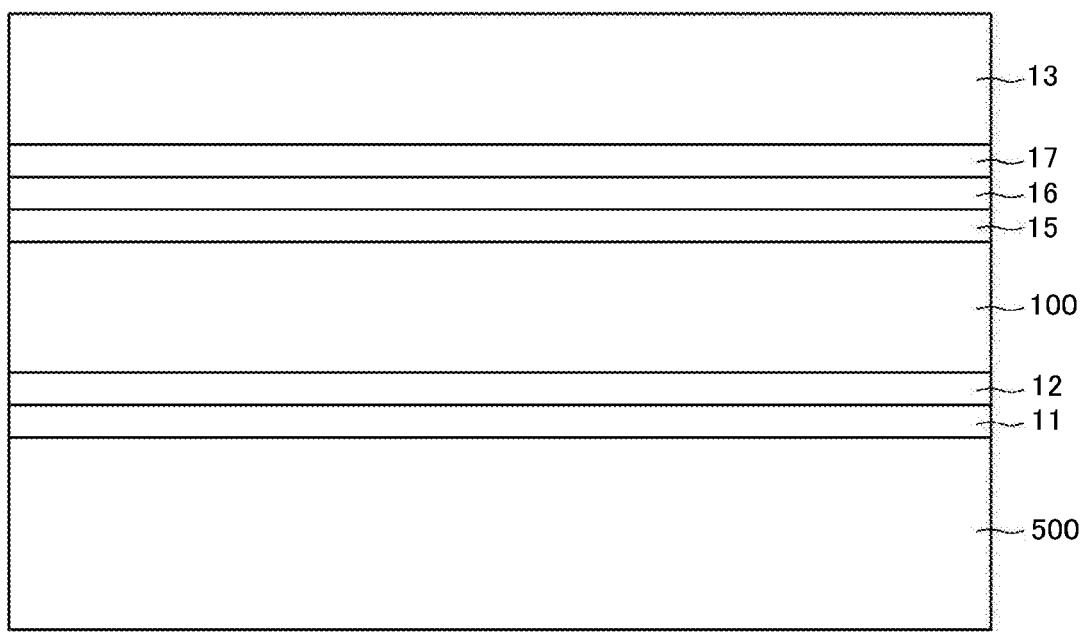
FIG. 19 is a cross sectional view that the polyamic acid for the second TFT substrate is coated on the second infrared absorption layer.

FIG. 19 is a cross sectional view that the polyamic acid 13 for the second TFT substrate 400 is coated on the second infrared absorption layer 17. A thickness of the polyamic acid 13 is controlled so that a thickness of the baked second polyimide substrate 400 is 10 to 20 microns.

Figure 20:
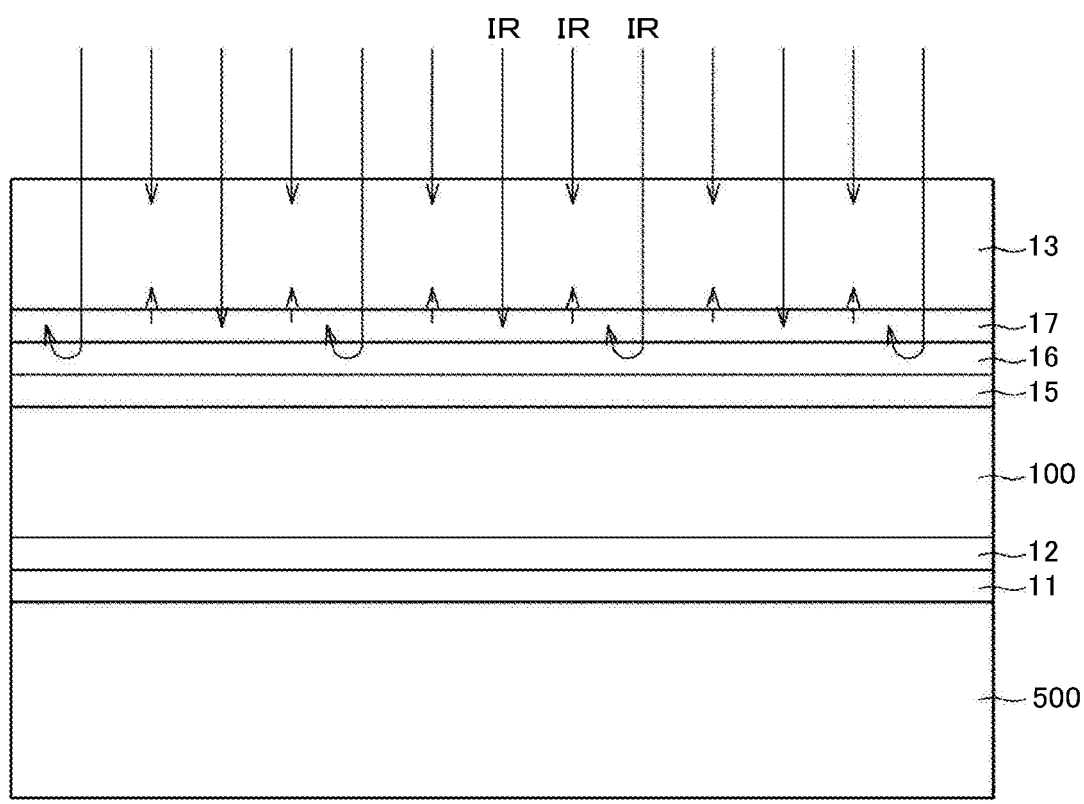
FIG. 20 is a cross sectional view that the polyamic acid layer is heated to form the second TFT substrate.

After that, as shown in FIG. 20, the polyamic acid 13 is heated and baked by infrared light. The baking condition of the polyamic acid 13 is the same as explained in FIG. 7 in embodiment 1. The heating mechanism of the polyamic acid 13 in FIG. 20 is also the same as explained in FIG. 8 in embodiment 1. Namely, the polyamic acid 13 is heated by the infrared light IR from the upper side; in addition, it is heated by reflected infrared light from the second infrared reflection layer 16 and further heated by heat conductance from the infrared absorption layer 17. Therefore, the polyamic acid 13 is efficiently baked.

After that, as shown in FIG. 16, the TFT circuit layer 101, the protective layer 102 and the circular polarizing plate 103 are formed on the second TFT substrate 400 in this order. After the organic EL display panel is formed, the laser beam is irradiated at the interface between the first infrared reflection layer 11 and the glass substrate 500 as shown in FIG. 16 to remove the glass substrate 500 by abrasion; then, the organic EL display panel explained in FIG. 15 is completed.

The structure of FIG. 15 is that the infrared absorption layer 12, 17 and the infrared reflection layer 11, 16 are formed on both of the first TFT substrate 100 and the second TFT substrate 400. In the tandem structure, however, the infrared absorption layer 12 or 17 and the infrared reflection layer 11 or 16 can be formed on either one of the first TFT substrate 100 or the second TFT substrate 400.

Figure 21:
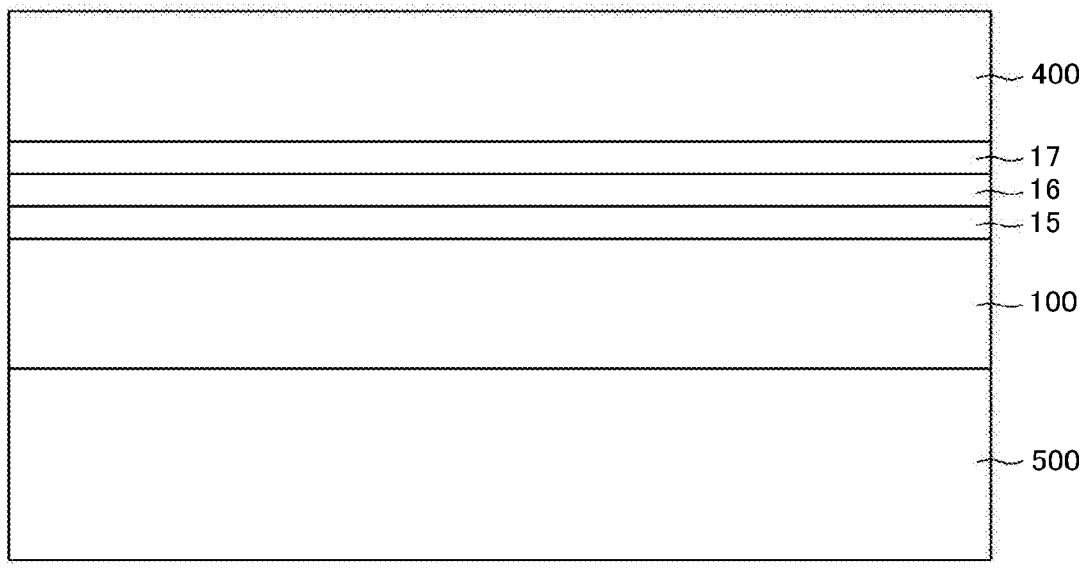
FIG. 21 is the second example of embodiment 2.

FIG. 21 is a second example of the tandem structure according to the present invention. In FIG. 21, the infrared absorption layer and the infrared reflection layer are not formed between the first TFT substrate 100 and the glass substrate 500, however, the infrared absorption layer 17 and the infrared reflection layer 16 are formed between the first TFT substrate 100 and the second TFT substrate 400.

In general, the polyamic acid 13 formed on the upper layer is rather difficult to absorb the heat, thus, it takes more time for baking. The feature of the example of FIG. 21 is that the present invention is applied to the upper polyimide substrate 400 to bake more efficiently the upper substrate 400.

The polyimide changes its characteristics when it is heated too much. The lower TFT substrate 100 has already been baked when the upper TFT substrate 400 is formed. Therefore, if the infrared absorption layer 17 and the infrared reflection layer 16 are formed before the upper polyimide substrate 400 is formed, the first polyimide substrate 100, which is lower substrate, can avoid being heated too much and avoid change of its characteristics.

As explained above, the structure of FIG. 21 can form the second TFT substrate 400, which is upper substrate, efficiently, as well as can avoid the change of characteristics of the first TFT substrate 100 caused by the polyimide of the first substrate 100 is heated too much. By the way, even in the structure of FIG. 21, in many cases, the metal layer or the insulating layer can be formed between the glass substrate 500 and the first TFT substrate 100 to increase adhesive strength between the glass substrate 500 and the first TFT substrate 100 or for easy release of the glass substrate 500 from the first TFT substrate 100 by laser beam abrasion.

Figure 22:
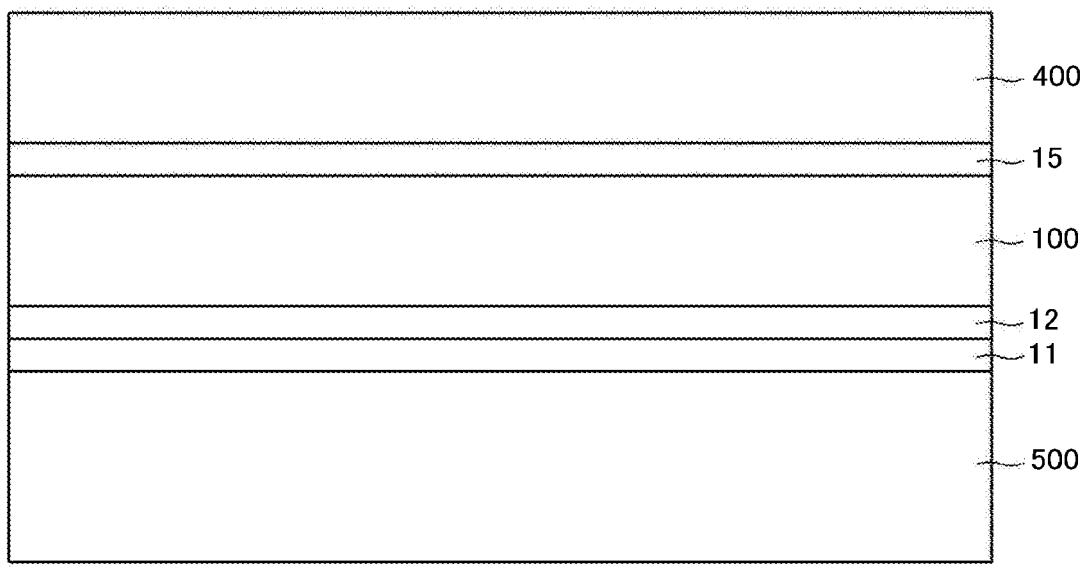
FIG. 22 is the third example of embodiment 2.

FIG. 22 is a cross sectional view of third example of the tandem structure according to the present invention. In FIG. 22, the infrared absorption layer and the infrared reflection layer are not formed between the first TFT substrate 100 and the second TFT substrate 400, however, the infrared absorption layer 12 and the infrared reflection layer 11 are formed between the first TFT substrate 100 and the glass substrate 500.

In this invention, the transparent conductive film is used as the infrared reflection layer 11. When the TFT substrate, which is formed by polyimide, is thin, a floating capacitance is generated between the transparent conductive film 11 and the scan lines or the video signal lines, etc. formed on the TFT substrate. Such a floating capacitance lowers the signal voltages, or delays writing the signals, etc.

If such a problem is anticipated, the infrared absorption layer 12 and the infrared reflection layer 11, which characterize the present invention, are formed when the first TFT substrate 100 is formed; however, when the second TFT substrate 400 is formed, only the SiO film 15 is formed between the first TFT substrate 100 and the second TFT substrate 400. In such a structure, a heating efficiency as a whole of the polyimide substrates can be improved if a thickness of the first TFT substrate 100 is made thicker than a thickness of the second TFT substrate 400 since heating efficiency of the first TFT substrate 100 is higher than that of the second TFT substrate 400.

Figure 23:
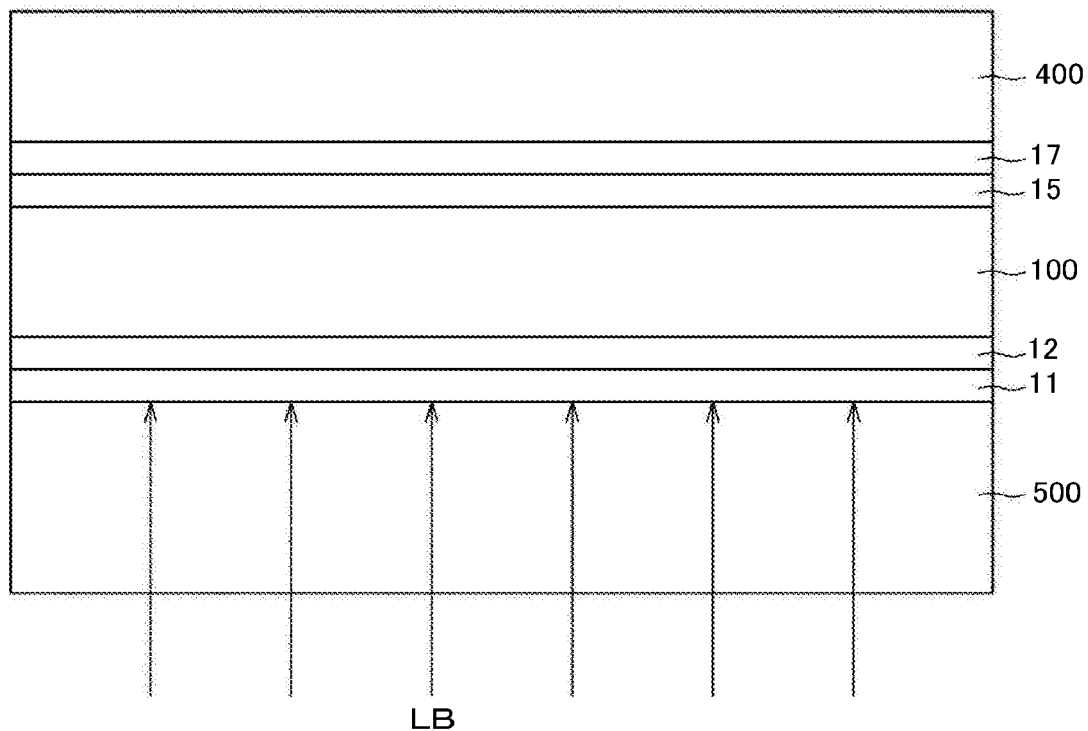
FIG. 23 is the fourth example of embodiment 2.

FIG. 23 is a cross sectional view of fourth example of the tandem structure according to the present invention. In FIG. 23, the infrared absorption layer 17 according to the present invention is formed, however, the infrared reflection layer formed by the transparent conductive film is not formed between the first TFT substrate 100 and the second TFT substrate 400. The infrared absorption layer 12 and the infrared reflection layer 11 according to the present invention is formed between the first TFT substrate 100 and the glass substrate 500.

In FIG. 23, since the infrared reflection layer of the transparent conductive film is not formed under the second TFT substrate 400, the floating capacitance is not increased. On the other hand, since the infrared absorption layer 17 is formed, heat efficiency for the polyimide substrate 400, which is the upper substrate, can be raised compared with the example of FIG. 22. The other structures are the same as explained in FIG. 22. For example, in FIG. 23, too, heat efficiency can be raised as a whole by making the thickness of the first TFT substrate 100 thicker than the thickness of the second TFT substrate 400. FIG. 23 shows the laser beam LB is irradiated at the interface between the glass substrate 500 and the infrared reflection layer 11 to separate the glass substrate 500 from the TFT substrate 100.

Embodiment 3

In manufacturing organic EL display device or the liquid crystal display device, it is not efficient to make a single display panel individually, thus, many display panels are formed in the mother substrate and then, separated to an individual display panel from the mother substrate. The size of the mother substrate is very big and can be as big as e.g. 1.5 m×1.8 m. On the other hand, a thickness of the glass is 0.5 mm or 0.7 mm, thus, mother substrate is very easy to warp. Difference of the thermal expansion coefficients between the polyimide and the glass is very big; therefore, according to the condition of baking of the polyimide, the mother substrate warps and as a result, it becomes unable to pass the manufacturing process.

Figure 24:
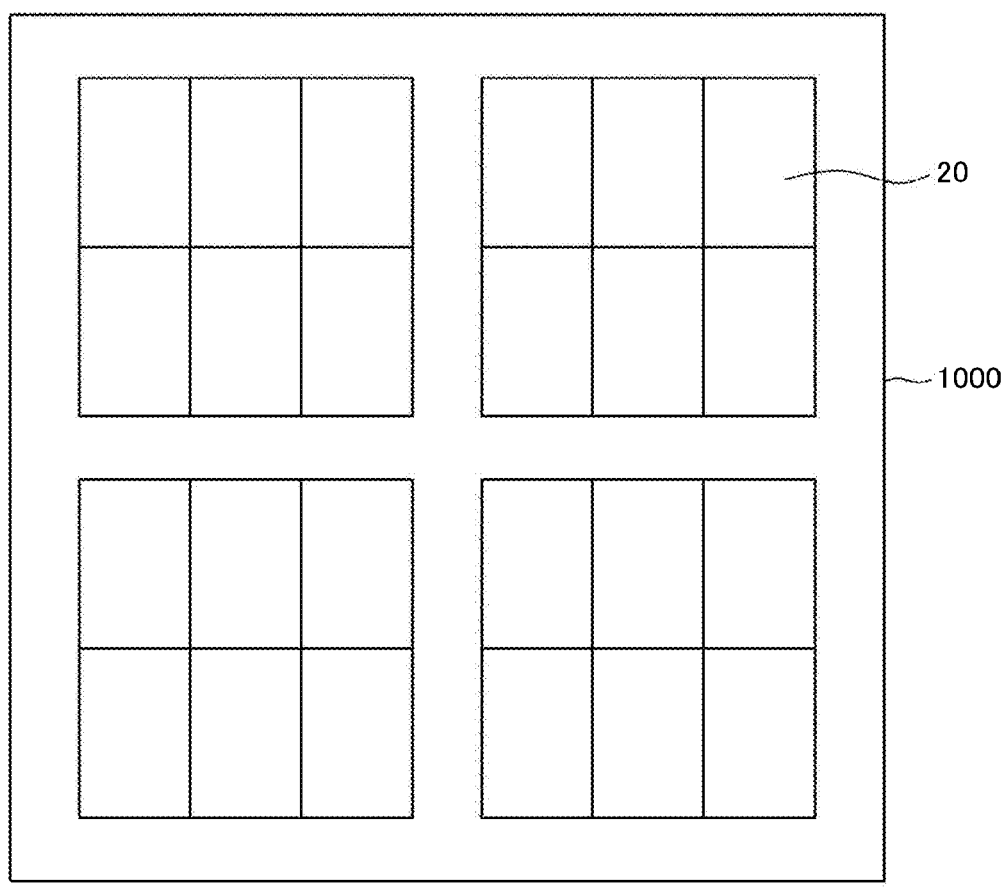
FIG. 24 is a plan view of the mother substrate.

Embodiment 3 gives a structure to mitigate the warping of the mother substrate by controlling the baking condition of the polyimide by specifying the area of the infrared absorbing layer 12 and the infrared reflection layer 11 formed under the polyimide substrate. Namely, warping of the mother substrate can be controlled by differentiating the time of curing of the polyimide according to the positions in the mother substrate. FIG. 24 is a plan view that display cells 20 are formed in the mother substrate 1000. FIG. 24 is only a model for explanation; in a case of small sized display panel used for e.g. cellar phones or tablets, they are formed in much more numbers in a mother substrate 1000.

The simplest structure is that: forming the infrared reflection layer 11 and the infrared absorption layer 12 on all over the mother substrate 1000; and forming the polyimide for the TFT substrate 100 on the infrared absorption layer 12. When the warping of the mother substrate 1000 occurred in this structure, this warping can be controlled by specifying the area of the infrared reflection layer 11 and the infrared absorption layer 12 according to the present invention.

By the way, absorption of the infrared light by the glass greatly changes according to the wavelength of the infrared light. As shown in FIG. 39, when the wave length is 2.7 microns or less, most infrared light passes through the glass substrate, however, when the wave length is 2.8 microns or more, the transmittance decreases drastically. Namely, the glass also absorbs the infrared light and is heated. However, since a thickness of the glass substrate 500 is 0.5 mm or 0.7 mm, approximately 85% of the infrared light transmits the glass; thus, heating efficiency to the glass by the infrared light is low.

On the other hand, the area that the infrared reflection layer 11 and the infrared absorption layer 12 are laminated, the polyamic acid, which is the precursor of the polyimide, is efficiently heated. Therefore, the time when the polyimide is cured where the polyimide is directly formed on the glass substrate 500 and the time when the polyimide is cured where the polyimide is formed on the laminated film of the infrared reflection layer 11 and the infrared absorption layer 12 are different. The difference in the time of curing of the polyimide influences the warping of the mother substrate 1000.

Figure 25:
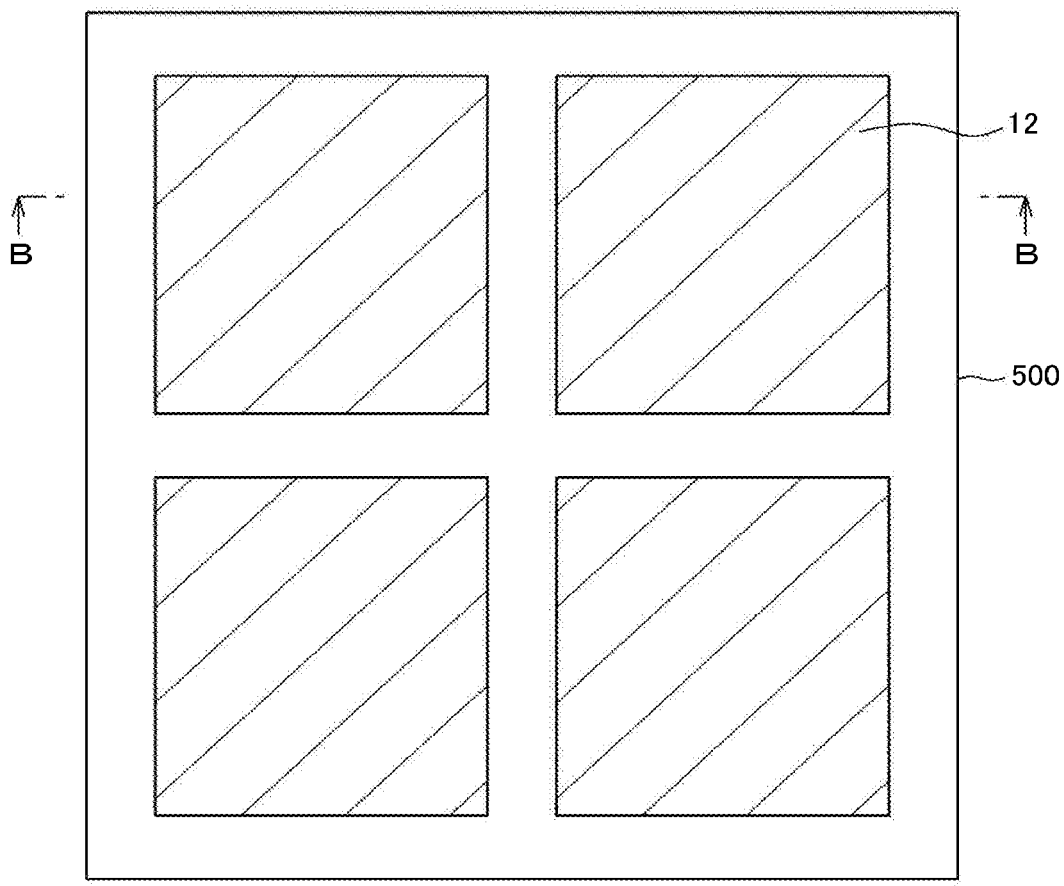
FIG. 25 is a plan view that shows an example of the area where the infrared absorption layer is formed according to embodiment 3.
Figure 26:
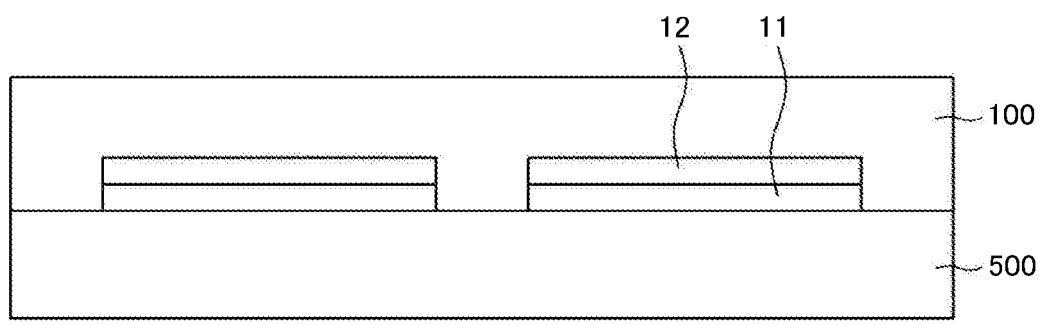
FIG. 26 is an example of a cross sectional view of FIG. 25 along the line B-B.

FIG. 25 is an example that the infrared absorption layer 12 of the metal oxide is formed in the area the display cells 20 are formed as in FIG. 24. The area of forming the infrared reflection layer 11 can be different according to the occasions. FIG. 26 is a cross sectional view of FIG. 25 along the line B-B, where the infrared reflection layer 11 and the infrared absorption layer 12 are formed in the same area.

In FIG. 26, the polyimide formed in the area that the infrared reflection layer 11 and the infrared absorption layer 12 are formed cures earlier, while the polyimide formed directly on the glass substrate 500 cures later. Therefore, the stress in the mother substrate 1000 of FIG. 26 is different from the stress in the mother substrate in FIG. 24, where the infrared absorption layer 12 is uniformly formed on all over the mother substrate 1000.

Figure 27:
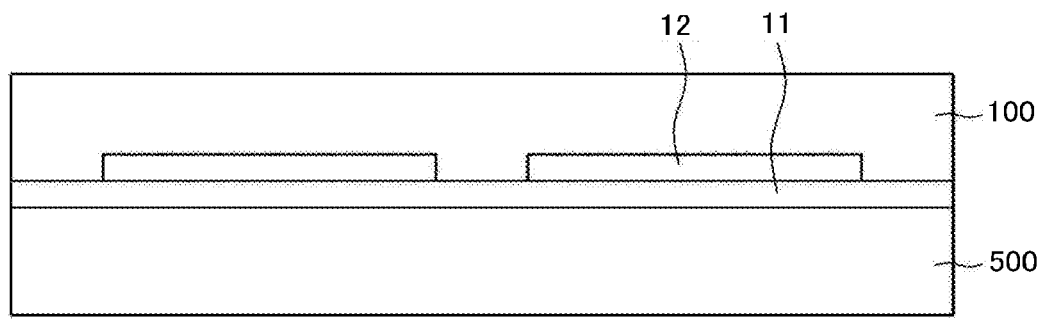
FIG. 27 is another example of a cross sectional view of FIG. 25 along the line B-B.

FIG. 27 is another example of a cross sectional view of FIG. 25 along the line B-B; however, FIG. 27 differs from FIG. 26 in that the infrared reflection layer 11 is formed on all over the mother substrate 1000. The polyimide cures later in the area where only the infrared reflection layer 11 is formed compared with the area where both the infrared reflection layer 11 and the infrared absorption layer 12 are formed.

The residual stress in the mother substrate 1000 is different between the structure of FIG. 26 and the structure of 27. Namely, as shown in FIG. 39, absorption rate of the infrared light by the glass, in other words, heat efficiency to the glass, is different according to the wave length of the infrared light. For example, provided the wave length of the infrared light is 2.8 microns or more, either one of structures of FIG. 26 or FIG. 27 can be chosen by considering the differences between the effect that the polyimide is heated by heat conductance from the heated glass and the effect that polyimide is heated by infrared light reflected from the infrared reflection layer 11.

Figure 28:
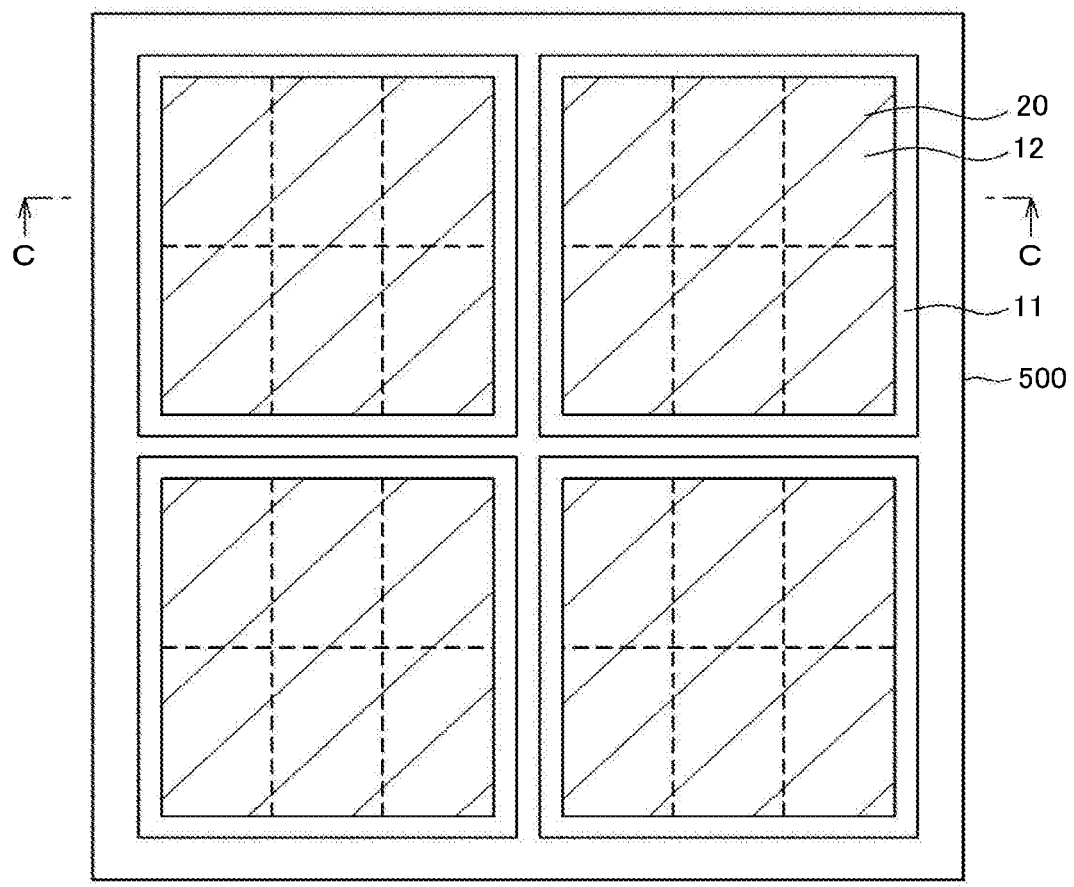
FIG. 28 is a plan view that shows another example of the area where the infrared absorption layer and the infrared reflection layer are formed according to embodiment 3.
Figure 29:
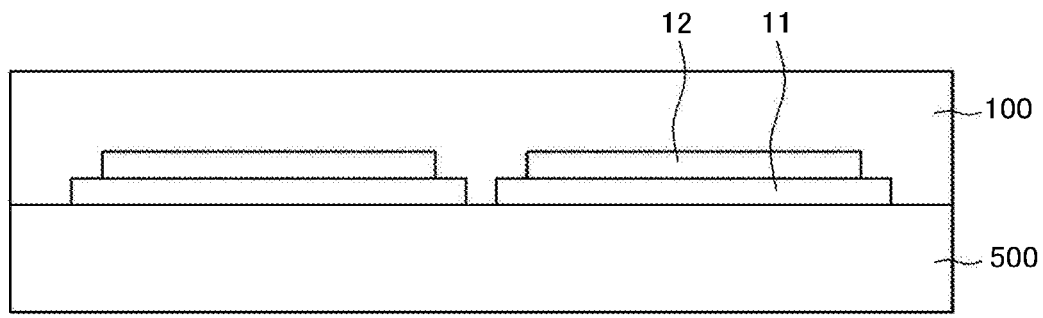
FIG. 29 is a cross sectional view of FIG. 28 along the line C-C.

FIG. 28 is yet another example according to the preset embodiment. In FIG. 28, the infrared absorption layer 12 is formed in the same area where the display cell 20 is formed; the infrared reflection layer 11 is formed in a bigger area than where the display cell 20 is formed, however, not all over the mother substrate 1000. FIG. 29 is a cross sectional view of FIG. 28 along the line C-C. In this case, curing time of the polyimide is differentiated into three to control the stress in the mother substrate 1000, namely, to control the warping of the mother substrate 1000.

Figure 30:
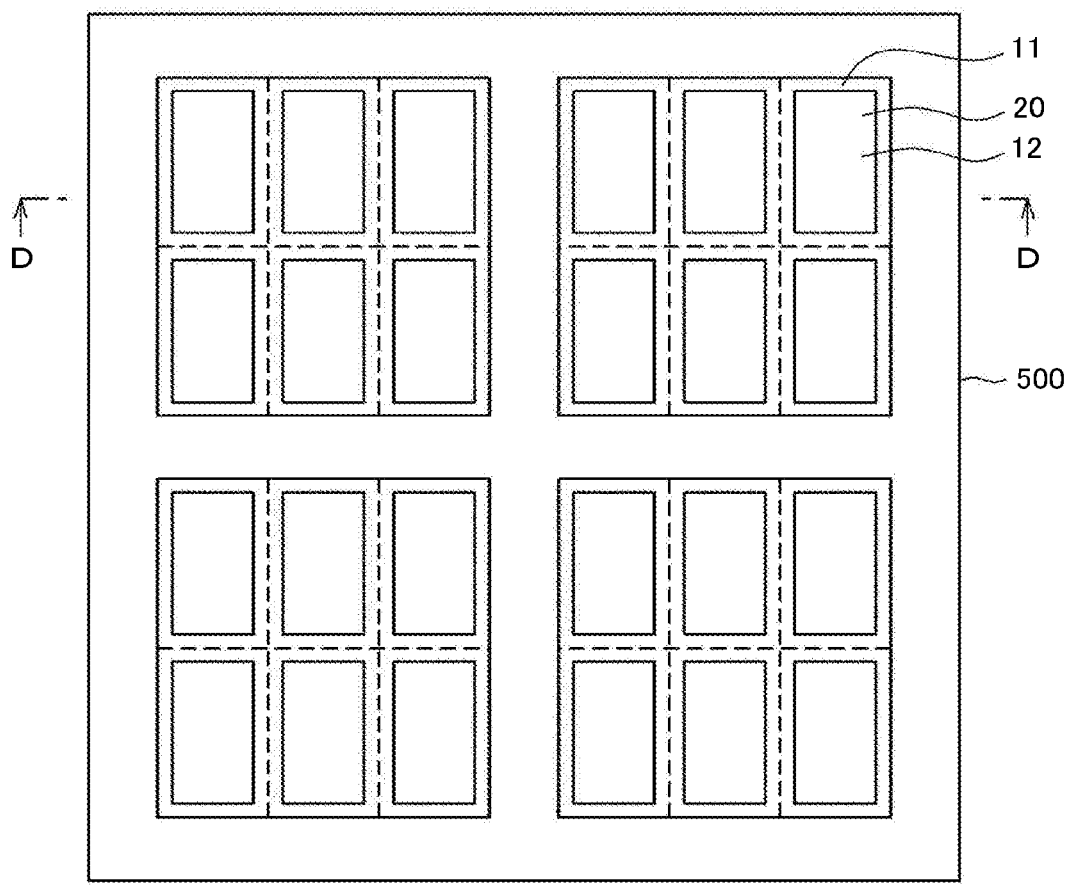
FIG. 30 is a plan view that shows yet another example of the area where the infrared absorption layer and the infrared reflection layer are formed according to embodiment 3.
Figure 31:
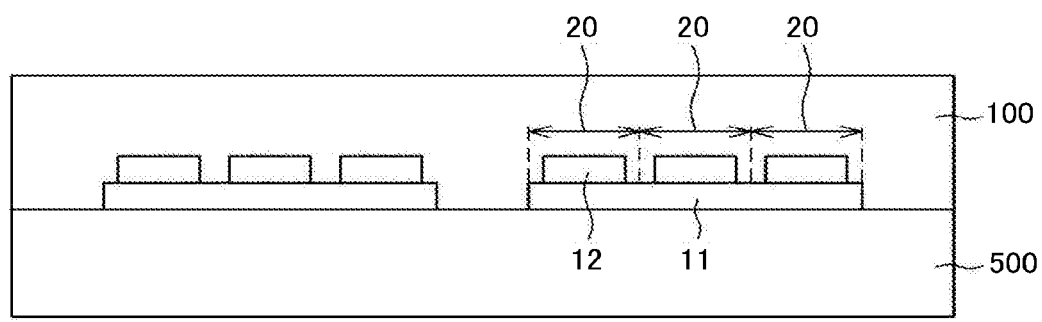
FIG. 31 is a cross sectional view of FIG. 30 along the line D-D.

FIG. 30 is further yet another example according to the present embodiment. In FIG. 30, the area for the infrared absorption layer 12 and the area for the infrared reflection layer 11 are differentiated in a display cell 20. In FIG. 30, the broken line is the boundary of individual display cell 20. FIG. 31 is a cross sectional view of FIG. 30 along the line D-D. In FIG. 31, the broken line is the boundary of individual display cell 20.

In FIG. 31, the infrared reflection layer 11 is formed in the same area as the display cell 20; however the infrared absorption layer 12 is formed in the area smaller than the area of the display cell 20. The structure of the present example can control the warping of the mother substrate 1000 as well as the warping of the individual display cell 20 after it is separated from mother substrate 1000.

Embodiment 4

Figure 32:
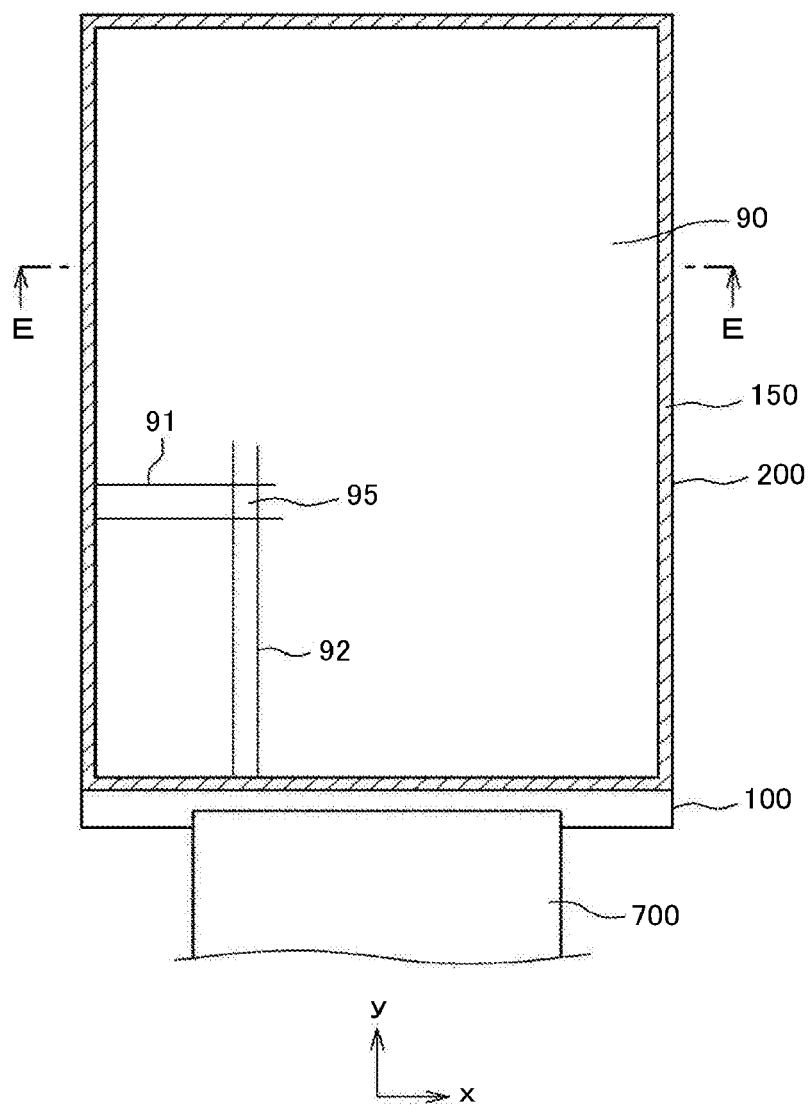
FIG. 32 is a plan view of the liquid crystal display device according to the present invention.

The above explanation is made when the present invention is applied to the organic EL display device. The present invention, however, can be applied to the liquid crystal display device. In some occasions, the liquid crystal display device is also required to be a flexible display device. FIG. 32 is a plan view of the liquid crystal display device. In FIG. 32, the TFT substrate 100 and the counter substrate 200 are adhered by the sealant 150; the liquid crystal is sandwiched between the TFT substrate 100 and the counter substrate 200, and is sealed inside of the sealant 150.

The display area 90 is made where the TFT substrate 100 and the counter substrate 200 overlap each other. The scan lines 91 extend in lateral direction (x direction) and are arranged in longitudinal direction (y direction). The video signal lines 92 extend in longitudinal direction and are arranged in lateral direction. The pixel 95 is formed in the area surrounded by the scan lines 91 and the video signal lines 92. The TFT substrate 100 is made bigger than the counter substrate 200; the area where the TFT substrate 100 does not overlap with the counter substrate 200 is the terminal area. The flexible wiring substrate 700 is connected to the terminal area to supply powers and signals to the liquid crystal display device.

Figure 33:
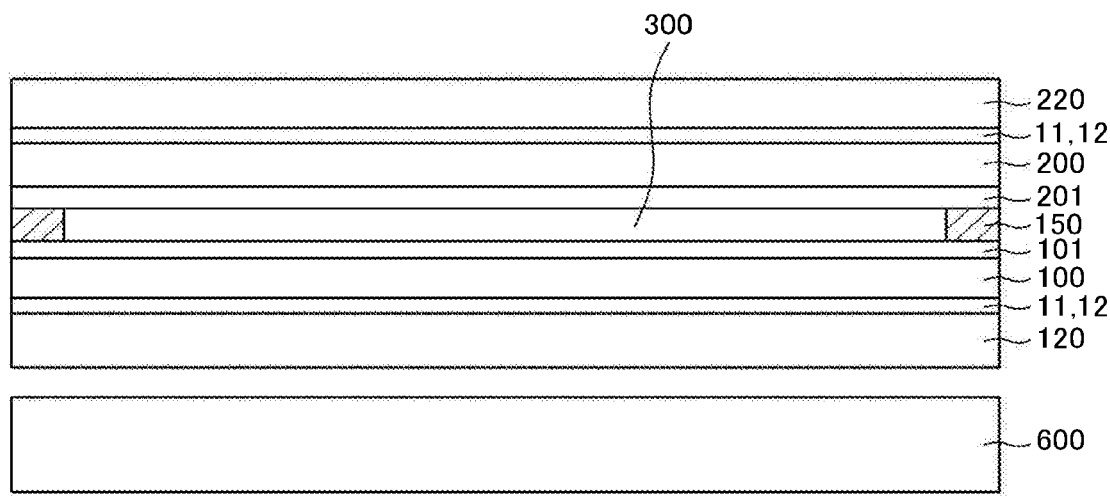
FIG. 33 is a cross sectional view of the liquid crystal display device.

FIG. 33 is a cross sectional view of FIG. 32 along the line E-E. In FIG. 33, the TFT wiring layer 101 is formed on the TFT substrate 100, which is made of polyimide; the color filter layer 201 is formed on the counter substrate 200, which is made of polyimide. The TFT substrate 100 and the counter substrate 200 are adhered by the sealant 150; the liquid crystal 300 is sealed inside.

In FIG. 33, the infrared reflection layer 11 and the infrared absorption layer 12 explained in embodiment 1 are formed on the outer surfaces of the TFT substrate 100 and the counter substrate 200. The upper polarizer 220 is adhered to the laminated film of the infrared reflection layer 11 and the infrared absorption layer 12 of the counter substrate 200, and the lower polarizer 120 is adhered to the laminated film of the infrared reflection layer 11 and the infrared absorption layer 12 of the TFT substrate 100.

In FIG. 33, the back light 600 is disposed at the back of the lower polarizer 120. If a sheet type light source, formed by e.g. organic EL light, is used for the back light 600, the liquid crystal display device can maintain flexibility as a whole.

Figure 34:
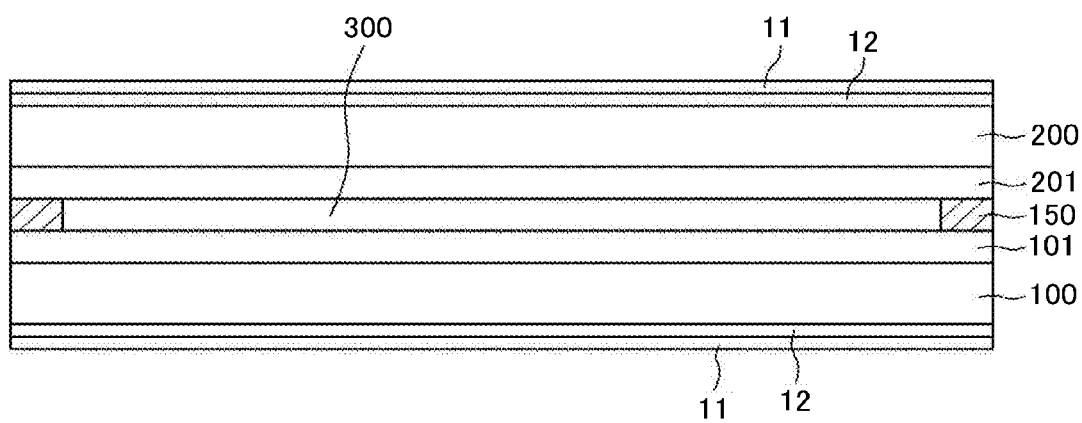
FIG. 34 is a cross sectional view of the liquid crystal display device according to the present invention.
Figure 35:
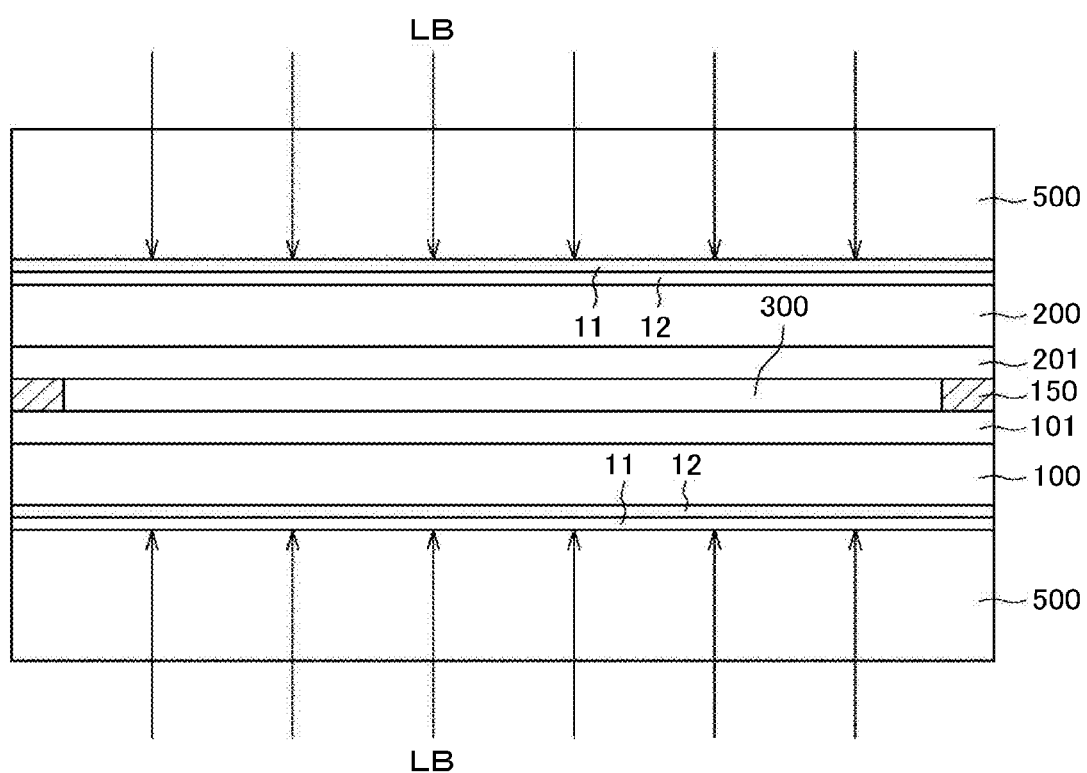
FIG. 35 is a cross sectional view that the laser beam is irradiated to separate the glass substrate.

FIG. 34 is a cross sectional view of the liquid crystal display panel, where the upper polarizer 220 and the lower polarizer 120 are removed. In FIG. 34, on the outer surface of the TFT substrate 100, the infrared absorption layer 12 made of the metal oxide is formed and the infrared reflection layer 11 made of the ITO is formed under the infrared absorption layer 12. Such a liquid crystal display panel is formed as follows. As depicted in FIG. 35, the TFT circuit layer 101 is formed on the TFT substrate 100 formed on the glass substrate 500; the color filter layer 201 is formed on the counter substrate 200 formed on the glass substrate 500; the liquid crystal 300 is filled and sealed by the sealant 150, which adheres the TFT substrate 100 and the counter substrate 200.

In this state, the infrared reflection layer 11 and the infrared absorption layer 12 exist between the TFT substrate 100 and the glass substrate 500 and between the counter substrate 200 and the glass substrate 500. After that, as shown in FIG. 35, the laser beam (LB) is irradiated at the interface between the glass substrate 500 and the infrared reflection layer 11 to separate the glass substrate 500 and the TFT substrate 100 by laser abrasion and the same process is applied to the counter substrate 200 to separate the glass substrate 500 and the counter substrate 200.

After all, the problem described in embodiment 1 is the same in the liquid crystal display device. In the case of the liquid crystal display device, however, the backlight is used; thus, the infrared reflection layer 11 and the infrared absorption layer 12 need to be transparent. In the present invention, the transparent conductive film as ITO is used for the infrared reflection layer 11, thus, transparency to the visible light is not a problem. The metal oxide as e.g. AlO is used for the infrared absorption layer 12; specifically, AlO is transparent to the visible light, thus, those layers can be used even the back light is used. Many of other metal oxides are transparent to the visible light; therefore, the structure explained in embodiment 1 through embodiment 3 can be applied to the liquid crystal display device.

What is claimed is:

1. A display device having plural pixels on a resin substrate comprising:
   a first layer, made of a metal oxide film, formed on a surface of the resin substrate opposite to a surface that the plural pixels are formed,
   a second layer, made of a transparent conductive film, formed in contact with a surface, which is opposite side to the resin substrate, of the first layer.

2. The display device according to claim 1, wherein the resin substrate is made of polyimide.

3. The display device according to claim 1, wherein the first layer is made of an aluminum oxide film.

4. The display device according to claim 1, wherein a thickness of the first layer is 10 to 100 nm.

5. The display device according to claim 1, wherein the second layer is made of an ITO film.

6. The display device according to claim 1, wherein a thickness of the second layer is 50 to 150 nm.

7. A display device having a laminated substrate including a first substrate made of resin, a second substrate made of resin laminated on the first substrate, and plural pixels on the second substrate comprising:
   a first layer, made of a metal oxide film, formed in contact with a surface of the first substrate opposite to the second substrate,
   a second layer, made of a transparent conductive film, formed in contact with a surface of the first layer opposite to the second substrate,
   a third layer, made of a metal oxide film, formed in contact with a surface of the second substrate opposing to the first substrate,
   a fourth layer, made of a transparent conductive film, formed in contact with a surface of the third layer opposing to the first substrate.

8. The display device according to claim 7, wherein the first substrate and the second substrate are made of polyimide.

9. The display device according to claim 7, wherein the first layer and the third layer are made of an aluminum oxide film.

10. The display device according to claim 7, wherein each of a thickness of the first layer and a thickness of the third layer is 10 to 100 nm.

11. The display device according to claim 7, wherein the second layer and the fourth layer are made of an ITO film.

12. The display device according to claim 7,
wherein each of a thickness of the second layer and a thickness of the fourth layer is 50 to 150 nm.

13. The display device according to claim 7,
a silicon oxide film is formed between the first substrate and the fourth layer.

14. The display device according to claim 7,
a thickness of the second substrate is thinner than a thickness of the first substrate.

15. A display device having a laminated substrate including a first substrate made of resin, a second substrate made of resin laminated on the first substrate, and plural pixels on the second substrate, wherein;
a first layer made of a metal oxide film is formed in contact with a surface of the first substrate opposite to the second substrate,
a second layer made of a transparent conductive film is formed in contact with a surface of the first layer,
or
the third layer made of a metal oxide film is formed in contact with a surface of the second substrate opposing to the first substrate,
the fourth layer made of a transparent conductive film is formed in contact with a surface of the third layer.

16. The display device according to claim 15,
wherein the first substrate and the second substrate are made of polyimide.

17. The display device according to claim 15,
wherein the first layer and the third layer are made of aluminum oxide film.

18. The display device according to claim 15,
wherein the second layer and the fourth layer are made of an ITO film.

19. The display device according to claim 15,
a thickness of the second substrate is thinner than a thickness of the first substrate.

20. The display device according to claim 15,
wherein a silicon oxide film is formed between the first substrate and the fourth layer.

* * * * *